US012294000B2

(12) United States Patent
Lim et al.

(10) Patent No.: US 12,294,000 B2
(45) Date of Patent: May 6, 2025

(54) FINGERPRINT SENSOR PACKAGE AND SMART CARD HAVING THE SAME

(71) Applicant: Samsung Electronics Co., Ltd., Suwon-si (KR)

(72) Inventors: Jaehyun Lim, Suwon-si (KR); Kwangjin Lee, Suwon-si (KR); Hyunjong Moon, Suwon-si (KR); Inho Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 54 days.

(21) Appl. No.: 18/322,795

(22) Filed: May 24, 2023

(65) Prior Publication Data

US 2024/0105703 A1 Mar. 28, 2024

(30) Foreign Application Priority Data

Sep. 26, 2022 (KR) ........................ 10-2022-0121753

(51) Int. Cl.
*G06K 19/073* (2006.01)
*G06V 40/13* (2022.01)
(Continued)

(52) U.S. Cl.
CPC ........ *H01L 25/18* (2013.01); *G06K 19/07354* (2013.01); *G06V 40/1306* (2022.01);
(Continued)

(58) Field of Classification Search
CPC ..... H01L 25/18; H01L 23/5388; H01L 24/37; H01L 24/40; H01L 24/41; H01L 25/50; H01L 24/16; H01L 24/73; H01L 24/84; H01L 2224/16145; H01L 2224/37013; H01L 2224/37124; H01L 2224/37147;
(Continued)

(56) References Cited

U.S. PATENT DOCUMENTS 9,812,623 B2 * 11/2017 Lee ................... H01L 33/387
11,900,709 B2 * 2/2024 Lim ................... G06V 40/12
(Continued)

FOREIGN PATENT DOCUMENTS

KR 101730138 B1 4/2017
KR 20190046082 A 5/2019
(Continued)

*Primary Examiner* — Antonio Xavier
(74) *Attorney, Agent, or Firm* — Myers Bigel, P.A.

(57) ABSTRACT

A fingerprint sensor package includes: a first substrate including a core insulating layer including a first surface and a second surface and a through-hole, a first bonding pad on the second surface, and an external connection pad between an edge of the second surface and the first bonding pad; a second substrate in the through-hole and including a third surface and a fourth surface, and including first sensing patterns on the third surface, spaced apart in a first direction, and extending in a second direction, second sensing patterns spaced apart from each other in the second direction and extending in the first direction, and a second bonding pad on the fourth surface; a conductive support electrically connecting the first bonding pad and the second bonding pad and supporting the first substrate and the second substrate; a controller chip on the second substrate; and a molding layer on the second surface.

20 Claims, 18 Drawing Sheets

(51) Int. Cl.
*H01L 23/00* (2006.01)
*H01L 23/538* (2006.01)
*H01L 25/00* (2006.01)
*H01L 25/18* (2023.01)

(52) U.S. Cl.
CPC ...... *G06V 40/1329* (2022.01); *H01L 23/5388* (2013.01); *H01L 24/37* (2013.01); *H01L 24/40* (2013.01); *H01L 24/41* (2013.01); *H01L 25/50* (2013.01); *H01L 24/16* (2013.01); *H01L 24/73* (2013.01); *H01L 24/84* (2013.01); *H01L 2224/16145* (2013.01); *H01L 2224/37013* (2013.01); *H01L 2224/37124* (2013.01); *H01L 2224/37147* (2013.01); *H01L 2224/40101* (2013.01); *H01L 2224/40106* (2013.01); *H01L 2224/40157* (2013.01); *H01L 2224/40499* (2013.01); *H01L 2224/4103* (2013.01); *H01L 2224/41051* (2013.01); *H01L 2224/41176* (2013.01); *H01L 2224/73205* (2013.01); *H01L 2224/84005* (2013.01); *H01L 2924/01039* (2013.01); *H01L 2924/0665* (2013.01)

(58) Field of Classification Search
CPC . H01L 2224/40101; H01L 2224/40106; H01L 2224/40157; H01L 2224/40499; H01L 2224/4103; H01L 2224/41051; H01L 2224/41176; H01L 2224/73205; H01L 2224/84005; H01L 2924/01039; H01L 2924/0665; H01L 23/3121; H01L 23/57; H01L 25/0652; G06K 19/07354; G06K 19/0718; G06K 19/07722; G06K 19/07724; G06K 19/07728; G06V 40/1306; G06V 40/1329; G06V 40/1318
See application file for complete search history.

(56) References Cited

U.S. PATENT DOCUMENTS

| | | | |
|---|---|---|---|
| 11,954,938 B2 * | 4/2024 | Lee | G06V 40/1329 |
| 2002/0125556 A1 * | 9/2002 | Oh | H01L 23/16 257/685 |
| 2006/0084254 A1 * | 4/2006 | Attarwala | H01L 24/75 257/E23.101 |
| 2007/0080464 A1 * | 4/2007 | Goebel | H01L 24/05 257/784 |
| 2009/0096111 A1 * | 4/2009 | Fujiwara | H01L 25/50 438/109 |
| 2021/0066192 A1 * | 3/2021 | Chen | H01L 23/5227 |
| 2021/0383185 A1 | 12/2021 | Mathieu et al. | |
| 2022/0027700 A1 | 1/2022 | Lee | |
| 2022/0129657 A1 | 4/2022 | Lim et al. | |
| 2023/0021212 A1 * | 1/2023 | Mo | G06K 19/0718 |

FOREIGN PATENT DOCUMENTS

| | | |
|---|---|---|
| KR | 102071490 B1 | 1/2020 |
| KR | 102195672 B1 | 12/2020 |
| KR | 20220013230 A | 2/2022 |
| KR | 20220056666 A | 5/2022 |

* cited by examiner

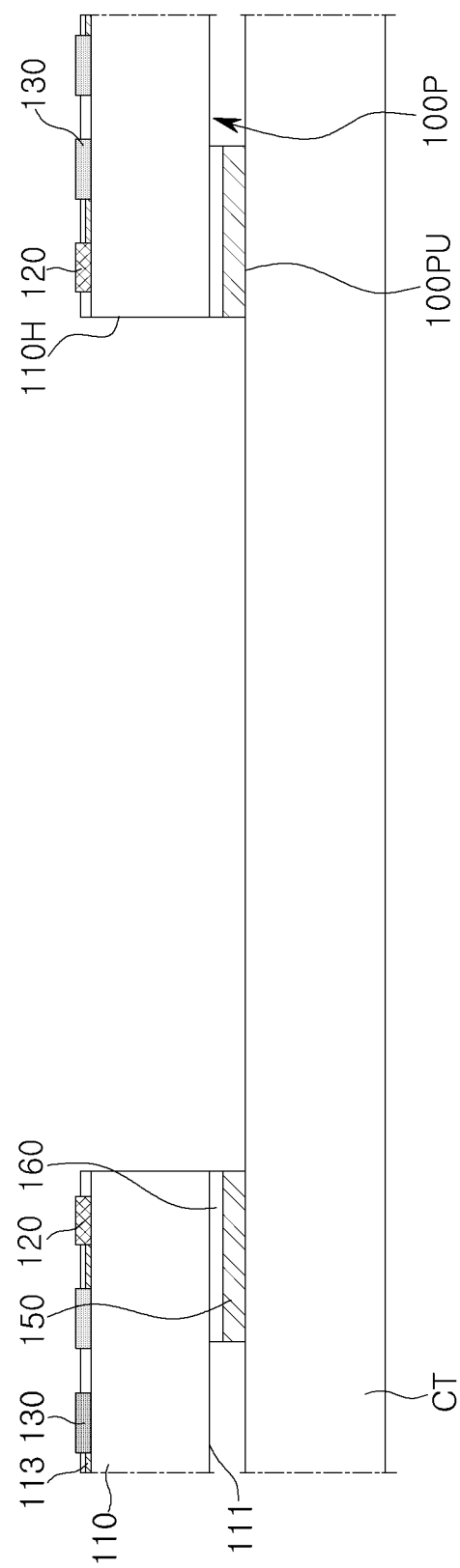

FINGERPRINT SENSOR PACKAGE AND SMART CARD HAVING THE SAME

CROSS-REFERENCE TO RELATED APPLICATION(S)

This application claims benefit of priority to Korean Patent Application No. 10-2022-0121753, filed on Sep. 26, 2022 in the Korean Intellectual Property Office, the disclosure of which is incorporated herein by reference in its entirety.

BACKGROUND

The present inventive concept relates to a fingerprint sensor package and a smart card including the same.

Fingerprint recognition technology may be used to prevent various security accidents by recognizing a user's fingerprint to undergo registration and authentication procedures. In particular, fingerprint recognition technology may be applied to personal and organizational network defense, protection of various contents and data, safe access to financial information, or the like. A fingerprint sensor may obtain user's fingerprint information using an optical method, a capacitive method, an ultrasonic method, a thermal sensing method, or the like. A recent trend in the fingerprint sensor industry may be to provide high reliability while continuously miniaturizing and thinning products. Accordingly, a fingerprint sensor package is required to be robust enough to not be damaged even when repeatedly used while improving reliability and sensitivity of acquisition of fingerprint information and reducing overall size and height.

SUMMARY

An aspect of the present inventive concept is to provide a fingerprint sensor package and a smart card including the fingerprint sensor package that are resistant to damage even after repeated use due to improved reliability.

According to an aspect of the present inventive concept, a fingerprint sensor package includes: a first substrate including a core insulating layer including a first surface and an opposite second surface and a through-hole extending through the first and second surfaces, a first bonding pad disposed along a circumference of the through-hole on the second surface of the core insulating layer, and an external connection pad between an edge of the second surface of the core insulating layer and the first bonding pad; a second substrate in the through-hole of the core insulating layer and including a third surface and an opposite fourth surface, the second substrate including a plurality of first sensing patterns on the third surface, spaced apart in a first direction and extending in a second direction intersecting the first direction, a plurality of second sensing patterns spaced apart from each other in the second direction and extending in the first direction, and a second bonding pad on the fourth surface; a conductive support electrically connecting the first bonding pad and the second bonding pad and supporting the first substrate and the second substrate; a controller chip on the second substrate; and a molding layer on the second surface of the core insulating layer, at least partially filling the through-hole between the first substrate and the second substrate, covering at least a portion of the second substrate and the first bonding pad, and spaced apart from the external connection pad.

According to an aspect of the present inventive concept, a fingerprint sensor package includes: a first substrate including a core insulating layer including a first surface and an opposite second surface, the first substrate including a through-hole, a first bonding pad extending along a circumference of the through-hole on the second surface, and an external connection pad on an edge of the second surface; a second substrate including a third surface including a sensing region and a peripheral region surrounding the sensing region and a fourth surface opposite to the third surface, and including a second bonding pad extending along an edge of the fourth surface; a conductive support vertically overlapping the first substrate and the second substrate, supporting the first substrate and the second substrate below the first substrate and the second substrate, and electrically connecting the first bonding pad and the second bonding pad to each other; and a controller chip on the fourth surface.

According to an aspect of the present inventive concept, a smart card includes: a card body including a groove region and a contact pad; a security chip in the card body; and a fingerprint sensor package configured to sense a user's fingerprint and transmit a signal for a sensing result to the security chip, wherein the fingerprint sensor package includes: a first substrate including a core insulating layer including a first surface and a second surface, opposite to each other, and having a substantially rectangular or square ring shape with a through-hole passing through the first and second surfaces, a first bonding pad disposed along a circumference of the through-hole on the second surface of the core insulating layer, and an external connection pad between an edge of the second surface of the core insulating layer and the first bonding pad; a second substrate in the through-hole of the core insulating layer and including a third surface and a fourth surface, opposite to each other, and including a plurality of first sensing patterns spaced apart in a first direction and extending in a second direction, perpendicular to the first direction, a plurality of second sensing patterns spaced apart from each other in the second direction and extending in the first direction, and a second bonding pad; a conductive support electrically connecting the first bonding pad and the second bonding pad and supporting the first substrate and the second substrate; a controller chip on the second substrate; and a molding layer on the second surface of the core insulating layer, filling the through-hole between the first substrate and the second substrate, at least partially covering the second substrate and the first bonding pad, and spaced apart from the external connection pad.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 5A to 5H are views illustrating a method of manufacturing a smart card in a process sequence according to an embodiment.

DETAILED DESCRIPTION

Figure 1:
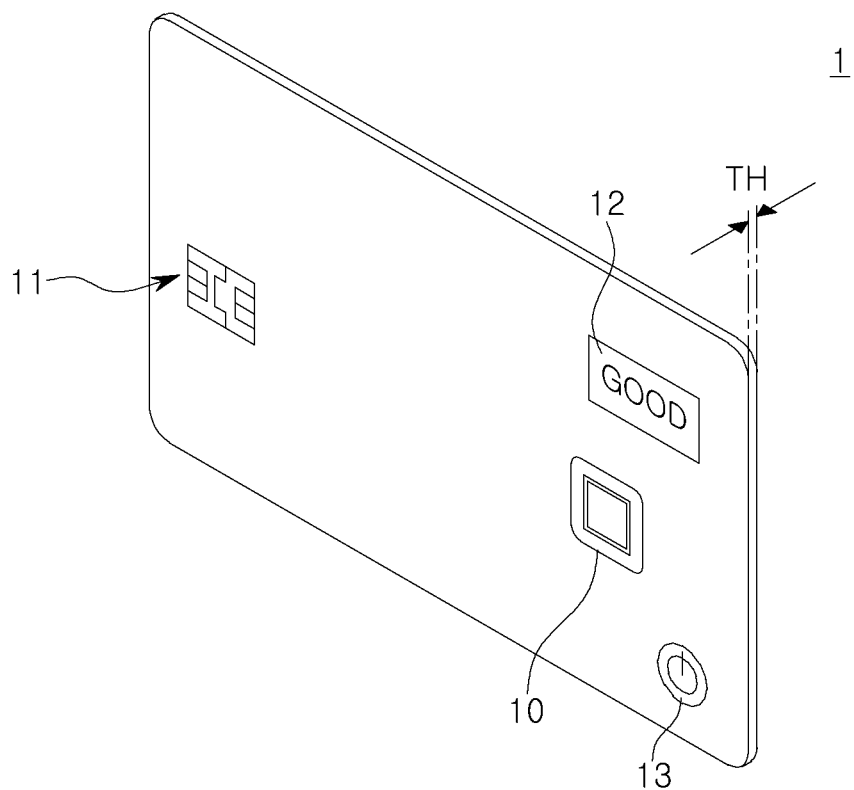
FIG. 1 is a schematic perspective view illustrating a smart card according to an embodiment.

FIG. 1 is a schematic perspective view illustrating a smart card 1 according to an embodiment.

Referring to FIG. 1, a smart card 1 may include a fingerprint sensor package 10, a security chip 11, a display or display unit 12, and a power actuator such as a power button 13.

The smart card 1 may further include information displayed on a conventional credit card or a conventional debit card, such as a card number identification or card number identification unit, an expiration date identification or expiration date identification unit, a user name, or the like. According to embodiments, the smart card 1 may further include an RF chip.

When a user brings his or her fingerprint into contact with a fingerprint sensor, the fingerprint sensor package 10 may recognize a contacted fingerprint. The fingerprint sensor package 10 may compare a recognized fingerprint and a registered fingerprint to determine whether the recognized fingerprint matches the registered fingerprint. The fingerprint sensor package 10 may operate after the smart card 1 is turned on.

The security chip 11 may store encrypted financial information. When the recognized fingerprint and the registered fingerprint match, the security chip 11 may grant payment authority to the user of the smart card 1. For example, the smart card 1 may prevent a financial accident due to theft or loss by allowing the security chip 11 to authorize the user to pay, based on a recognition result of the fingerprint sensor package 10.

The display unit 12 may display whether the recognized fingerprint matches the registered fingerprint, whether the smart card 1 is turned on or off, or the like. The display unit 12 may display letters, numbers, special symbols, or the like, and may further include a light emitting unit or light emitter in some cases. Depending on a type of smart card 1, the display unit 12 may be omitted.

The power button 13 may turn the smart card 1 on or off. The smart card 1 in an off state may be converted to be in an on state by manipulating the power button 13, and the smart card 1 in an on state may be converted to be in an off state by manipulating the power button 13. In addition, when a set time elapses after the smart card 1 is converted to be in an on state, the smart card 1 may be automatically converted to be in an off state. Depending on a type of smart card 1, the power button 13 may be omitted.

In some embodiments, a thickness TH of the smart card 1 may range from about 0.5 mm to about 1 mm. In addition, the thickness TH of the smart card 1 may be about 0.84 mm or less in accordance with international standards. For example, the thickness TH of the smart card 1 may be about 0.76 mm or less.

Since a smart card 1 according to an embodiment may include the fingerprint sensor package 10, and may have the same thickness as a conventional credit card or a conventional debit card, while maintaining a manner in which the conventional credit card or the conventional debit card is used, a high level of security may be provided to the user. In addition, a shape of a cross-section of the smart card 1 of this embodiment may be substantially identical or similar to that schematically illustrated in FIG. 5H.

FIGS. 2A to 2E are views illustrating a fingerprint sensor package 10 according to an embodiment.

Figure 2A:
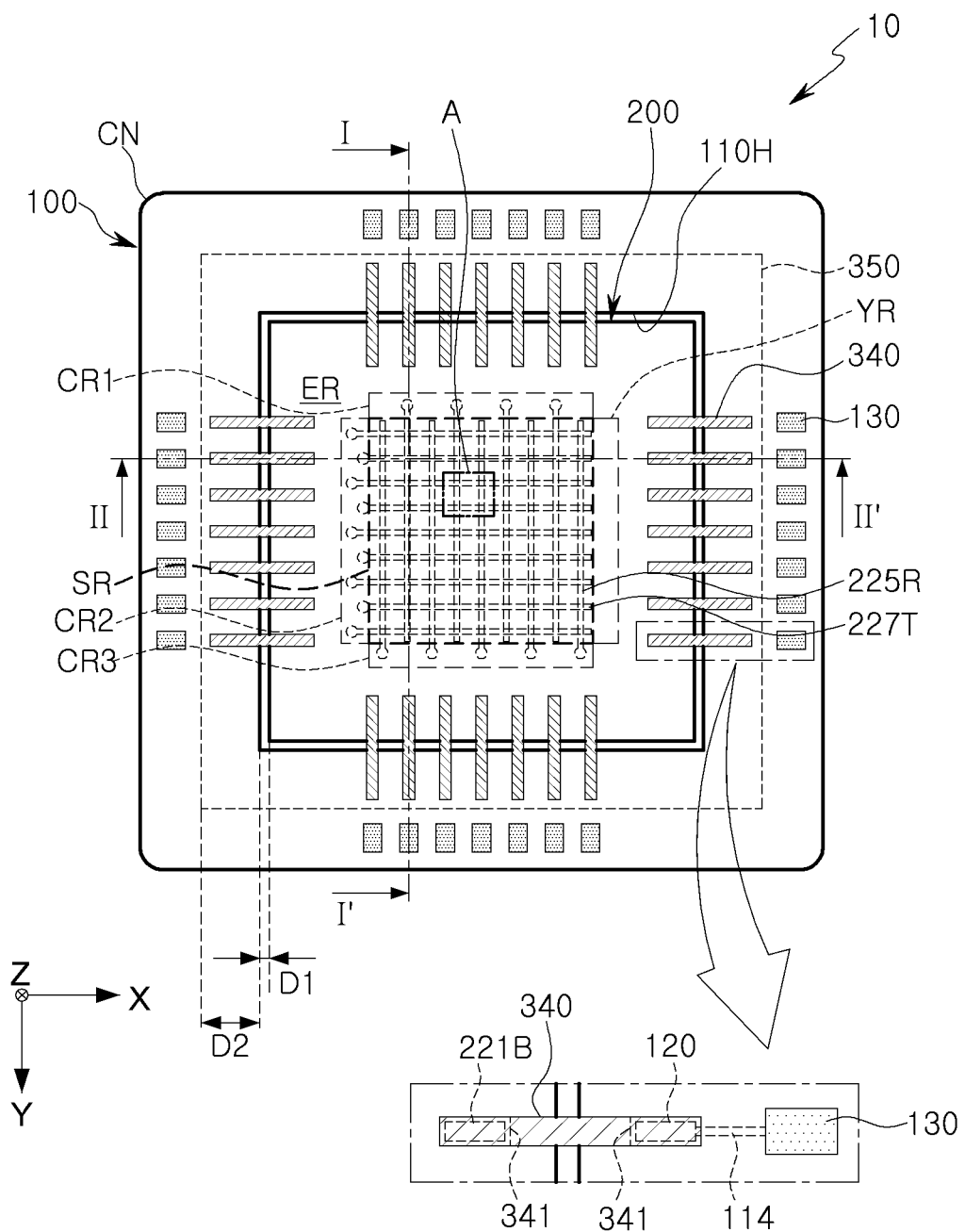
FIGS. 2A to 2E are views illustrating a fingerprint sensor package according to an embodiment.
Figure 2B:
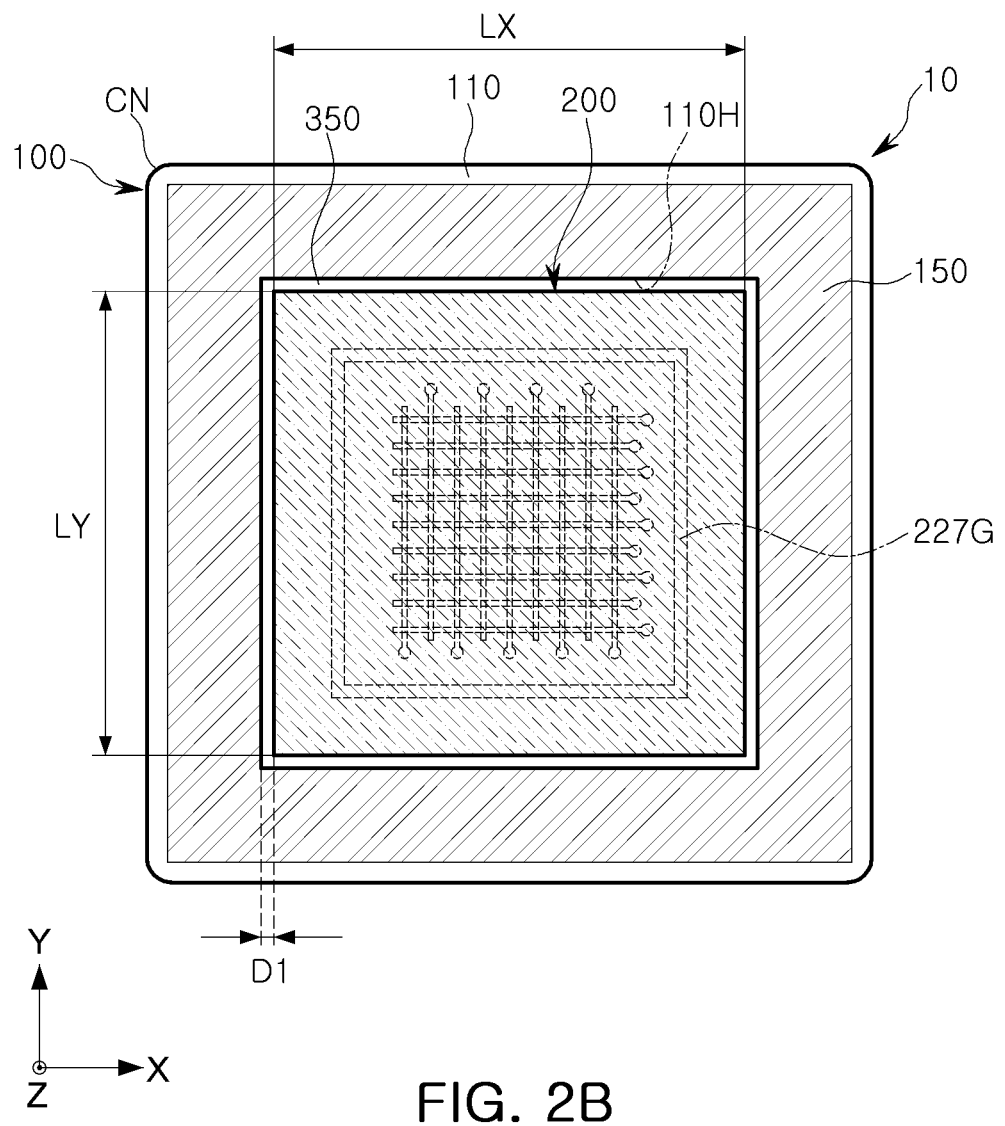
Figure 2C:
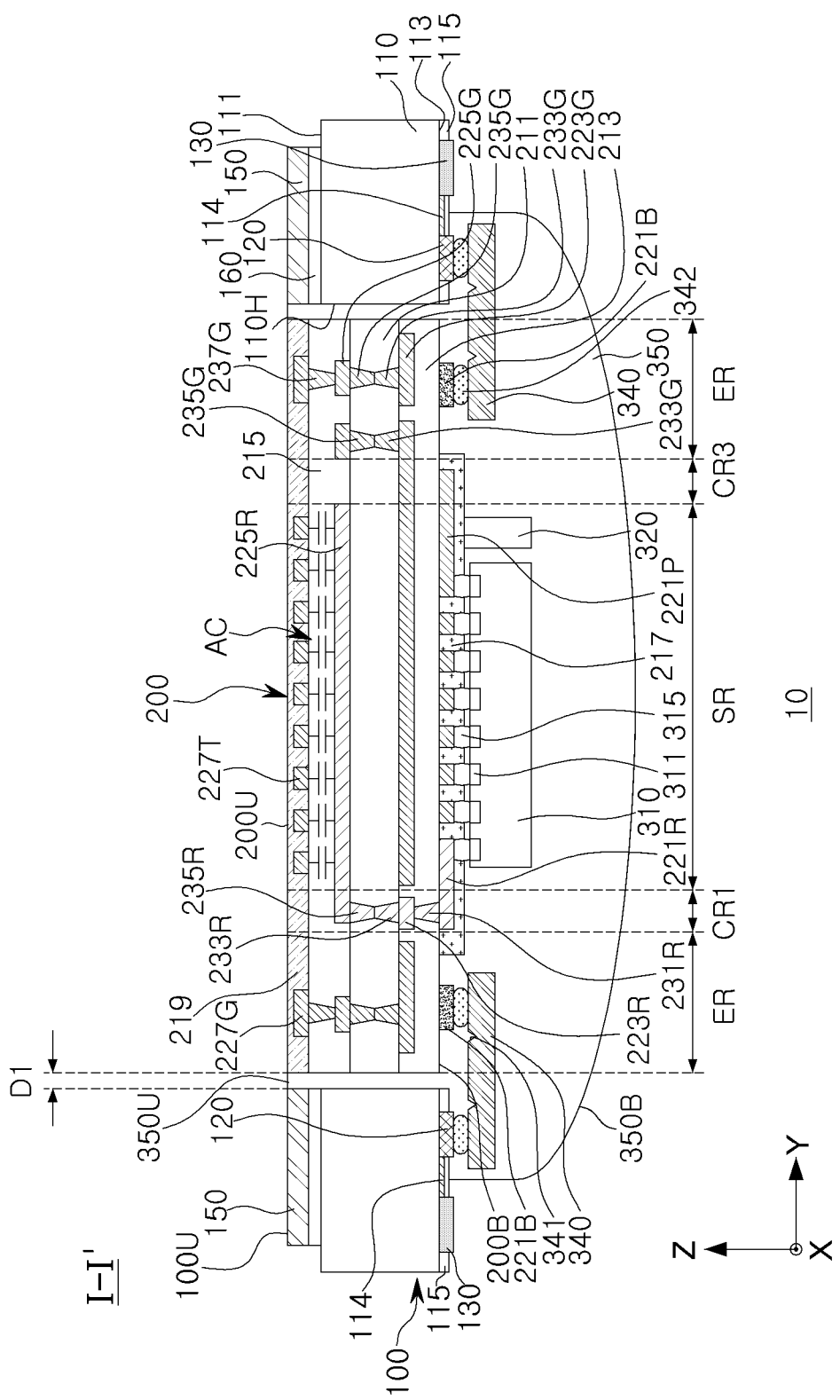
Figure 2D:
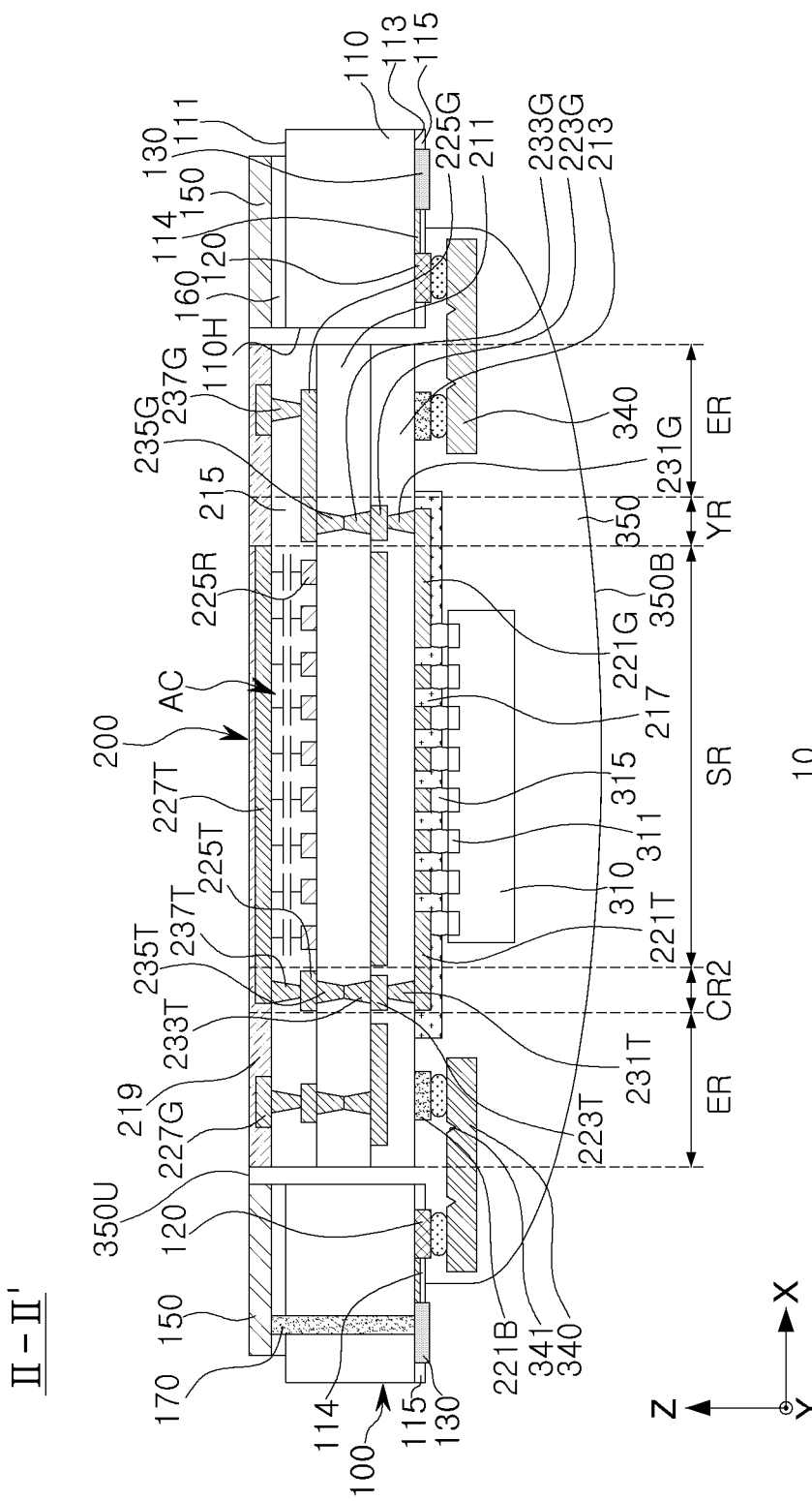
Figure 2E:
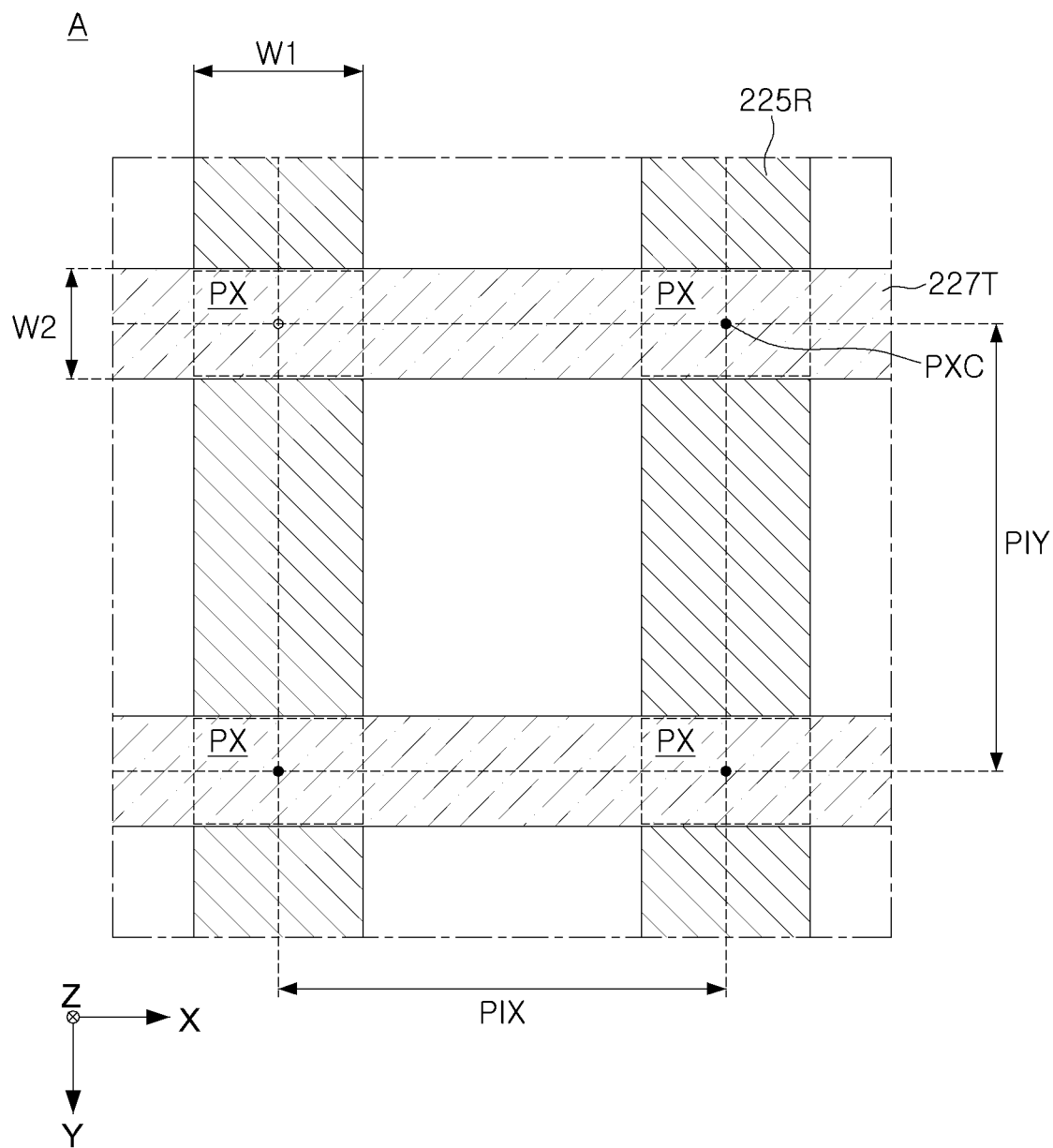

Specifically, FIG. 2A is a bottom view schematically illustrating a layout of some components of a fingerprint sensor package 10, FIG. 2B is a plan view illustrating the fingerprint sensor package 10 of FIG. 2A, FIG. 2C is a cross-sectional view of FIG. 2A, taken along line I-I', FIG. 2D is a cross-sectional view of FIG. 2A, taken along line II-II', FIG. 2E is an enlarged view of portion "A" in FIG. 2A.

Referring to FIGS. 2A to 2E, the fingerprint sensor package 10 may include a first substrate 100, a second substrate 200, a controller chip 310, a passive element 320, a conductive support 340, and a molding layer 350.

A fingerprint sensor package 10 according to an embodiment may have a total thickness of about 0.76 mm or less. In some embodiments, the total thickness of the fingerprint sensor package 10 may be less than or equal to about 0.5 mm. For example, the total thickness of the fingerprint sensor package 10 may range from about 0.1 mm to about 0.4 mm or from 0.1 mm to 0.4 mm. Therefore, the fingerprint sensor package 10 may be easily applied to various products (e.g., the smart card described above) that may be bent or may require a thin thickness.

The first substrate 100 may include a core insulating layer 110, first bonding pads 120, external connection pads 130, a ground bezel 150, and an adhesive layer 160. The first substrate 100 may include a printed circuit board (PCB). In example embodiments, the first substrate 100 may include a flexible PCB (FPCB) having flexibility to be bendable. In other example embodiments, the first substrate 100 may also include a rigid type PCB.

The core insulating layer 110 may have a substantially rectangular planar shape or a square planar shape, and may be provided as a flexible film or plate. The core insulating layer 110 may include a first surface 111 and a second surface 113, opposite to each other. In this case, a direction, parallel to a pair of edges of the core insulating layer 110, may be defined as a first direction (an X-direction), a direction, parallel to the other pair of edges of the core insulating layer 110, may be defined as a second direction (a Y-direction), and a direction, perpendicular to a main surface (the first surface 111 or the second surface 113) of the core insulating layer 110, may be defined as a third direction (a Z-direction).

The core insulating layer 110 may include an insulating material. For example, the core insulating layer 110 may be a flexible film including polyimide. For example, the core insulation layer 110 may be formed of an epoxy resin, or a synthetic resin such as acrylic, polyether nitrile, polyether sulfone, polyethylene terephthalate, polyethylene naphthalate, or the like.

A through-hole 110H penetrating through the first surface 111 and the second surface 113 may be formed in approximately a central portion of the core insulating layer 110. The second substrate 200 may be accommodated in the through-hole 110H, and the through-hole 110H may be formed to be larger than the second substrate 200 such that a sidewall of the through-hole 110H and a sidewall of the second substrate 200 do not come into contact with each other or are spaced apart from each other. In example embodiments, a first distance D1 between the sidewall of the through-hole 110H and the sidewall of the second substrate 200 may range from about 0.1 mm to about 3.0 mm. The through-hole 110H may be formed to have a substantially rectangular or square shape. The core insulating layer 110 may have a substantially rectangular or square ring shape.

Referring to FIGS. 2A and 2C, the first bonding pads 120 may be disposed around the through-hole 110H on the second surface 113 of the core insulating layer 110. For example, the first bonding pads 120 may be arranged along at least a portion of edges of the through-hole 110H of the core insulating layer 110. The first bonding pads 120 may be connected to the conductive support 340, and may be electrically connected to second bonding pads 221B of the second substrate 200 through the conductive support 340.

The external connection pads 130 may be disposed on the second surface 113 of the core insulating layer 110. The external connection pads 130 may be disposed adjacent to an edge of the second surface 113 of the core insulating layer 110, and may be arranged along the edge of the second surface 113 of the core insulating layer 110. The external connection pad 130 may be closer to the edge of the second surface 113 of the core insulating layer 110 than the first bonding pad 120. For example, a distance between the edge of the second surface 113 of the core insulating layer 110 and the external connection pads 130 may be shorter than a distance between the edge of the second surface 113 of the core insulating layer 110 and the first bonding pad 120. The external connection pads 130 may be pads electrically and physically connected to an external device (e.g., the card body 500 of FIG. 5G). The external connection pads 130 may be electrically connected to the first bonding pads 120 through a conductive pattern 114 provided on the second surface 113 of the core insulating layer 110. An insulating layer 115 covering the conductive pattern 114 may be disposed on the second surface 113 of the core insulating layer 110.

For example, the first bonding pads 120 and the external connection pads 130 may include at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and alloys thereof.

Referring to FIGS. 2B and 2C, the ground bezel 150 may extend along a circumference of the through-hole 110H. The ground bezel 150 may have a ring shape (e.g., rectangular or square ring shape) planarly surrounding the through-hole 110H. The ground bezel 150 may be attached to the first surface 111 of the core insulating layer 110 by the adhesive layer 160. When the through-hole 110H is formed in a substantially central portion of the first surface 111 of the core insulating layer 110, the ground bezel 150 may be disposed in an outer portion of the first surface 111 of the core insulating layer 110. The ground bezel 150 may be closer to an edge of the first surface 111 of the core insulating layer 110 than the first bonding pad 120. For example, a horizontal distance between the edge of the first surface 111 of the core insulating layer 110 and the ground bezel 150 may be shorter than a horizontal distance between the edge of the first surface 111 of the core insulating layer 110 and the first bonding pad 120. The ground bezel 150 may be disposed at the edge of the core insulating layer 110 to reduce sensing noise while a user's fingerprint contacts an upper surface of the second substrate 200 bonded to the first substrate 100. For example, the ground bezel 150 may include a conductive material, for example, a metal material such as copper (Cu) or aluminum (Al). The ground bezel 150 may be electrically grounded. In example embodiments, the ground bezel 150 may be configured to receive a reference potential through a conductive via 170 penetrating through the core insulating layer 110 and the adhesive layer 160. The conductive via 170 may be configured to electrically connect the ground bezel 150 and the external connection pad 130, and may be used as an electrical path for transferring the reference potential to the ground bezel 150.

In example embodiments, the first substrate 100 may have a shape in which all outer corners CN are rounded. In some embodiments, a curvature radius (or radius of curvature) of the outer corner CN of the first substrate 100 may range from about 0.1 mm to about 2 mm. For example, the curvature radius of the outer corner CN of the first substrate 100 may be about 1 mm. The reason why the outer corner CN of the first substrate 100 has a rounded shape may be provided to effectively prevent a crack that may occur at the outer corner CN during a process of cutting a first panel substrate 100P (see FIG. 5F) using a punching facility PM (see FIG. 5E).

The second substrate 200 may have a substantially rectangular planar shape or a substantially square planar shape. The second substrate 200 may include an upper surface 200U and a lower surface 200B, opposite to each other. The upper surface 200U of the second substrate 200 may be a surface contacted for fingerprint recognition, and the lower surface 200B of the second substrate 200 may be a surface on which components such as the controller chip 310 or the like are mounted. The second substrate 200 may be received in the through-hole 110H of the first substrate 100, and may be electrically connected to the first substrate 100 through the conductive support 340. For example, the second bonding pads 221B of the second substrate 200 may be bonded or connected to the first bonding pads 120 of the first substrate 100 through the conductive support 340. A thickness of the second substrate 200 may be substantially the same as a thickness of the first substrate 100. Therefore, when the second substrate 200 is accommodated in the through-hole 110H of the first substrate 100, the upper surface 200U of the second substrate 200 may be substantially coplanar with an upper surface 100U of the first substrate 100. However, the inventive concept is not limited thereto, and a thickness of the second substrate 200 may be thicker than a thickness of the first substrate 100. A first length LX of the second substrate 200 in the first direction (the X-direction) may range from about 10 mm to about 15 mm. In addition, a second length LY of the second substrate 200 in the second direction (the Y-direction) may range about 10 mm to about 15 mm. For example, the first length LX of the second substrate 200 may be about 12.7 mm, and the second length LY may be about 12.7 mm.

Referring to FIG. 2C, the second substrate 200 may include a base layer 211, a lower insulating layer 213 on a lower surface of the base layer 211, an upper insulating layer 215 on an upper surface of the base layer 211, a lower protective layer 217 on a lower surface of the lower insulating layer 213 and an upper protective layer 219 on an upper surface of the upper insulating layer 215.

The second substrate 200 may include a printed circuit board (PCB). In example embodiments, the second substrate 200 may include a rigid type printed circuit board.

In addition, the second substrate 200 may be a multilayer PCB including a plurality of conductive layers. The second substrate 200 may include conductive layers located at different vertical levels, and conductive vias for electrically connecting the conductive layers to each other. The conductive layers and the conductive vias may include at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and alloys thereof.

For example, the second substrate 200 may include first conductive layers 221B, 221G, 221R, 221T, and 221P, second conductive layers 223G, 223R, and 223T, third conductive layers 225G, 225R, and 225T, and fourth conductive layers 227G and 227T, in order of farther distance from the upper surface 200U. The first conductive layers 221B, 221G, 221R, 221T, and 221P may be on the lower surface of the lower insulating layer 213, the second conductive layers 223G, 223R, and 223T may be on the lower surface of the base layer 211, the third conductive layers 225G, 225R, and 225T may be on the upper surface of the base layer 211, and the fourth conductive layers 227G and 227T may be on the upper surface of the upper insulating layer 215.

The first conductive layers 221B, 221G, 221R, 221T, and 221P may include second bonding pads 221B, 1-1 sensing pads 221R, 1-2 sensing pads 221T, a first ground pattern 221G, and a power pattern 221P. The second conductive layers 223G, 223R, and 223T may include 2-1 sensing pads 223R, 2-2 sensing pads 223T, and a second ground pattern 223G. The third conductive layers 225G, 225R, and 225T may include first sensing patterns 225R, 3-2 sensing pads 225T, and a third ground pattern 225G. The fourth conductive layers 227G and 227T may include second sensing patterns 227T and a fourth ground pattern 227G.

In addition, the second substrate 200 may include first conductive vias 231G, 231R, and 231T for electrically connecting the first conductive layers 221B, 221G, 221R, 221T, and 221P and the second conductive layers 223G, 223R, and 223T, second conductive vias 233G, 233R, and 233T and third conductive vias 235G, 235R, and 235T, for electrically connecting the second conductive layers 223G, 223R, 223T and the third conductive layers 225G, 225R, and 225T, and fourth conductive vias 237T and 237G for electrically connecting the third conductive layers 225G, 225R and 225T and the fourth conductive layers 227G and 227T. The first conductive vias 231G, 231R, and 231T may at least partially penetrate the lower insulating layer 213, the second conductive vias 233G, 233R, and 233T may partially penetrate the base layer 211, the third conductive vias 235G, 235R, and 235T may partially penetrate the base layer 211, and the fourth conductive vias 237T and 237G may at least partially penetrate the upper insulating layer 215.

The first conductive vias 231G, 231R, and 231T may include 1-1 sensing vias 231R for electrically connecting the 1-1 sensing pads 221R and the 2-1 sensing pads 223R, 1-2 sensing vias 231T for electrically connecting the 1-2 sensing pads 221T and the 2-2 sensing pads 223T, and a first ground via 231G for electrically connecting the first ground pattern 221G and the second ground pattern 223G. In example embodiments, the first conductive vias 231G, 231R, and 231T may have a tapered structure in which a horizontal width decreases toward the base layer 211.

The second conductive vias 233G, 233R, and 233T may include 2-1 sensing vias 233R for electrically connecting the 2-1 sensing pads 223R and the first sensing patterns 225R, 2-2 sensing vias 233T for electrically connecting the 2-2 sensing pads 223T and 3-2 sensing pads 225T, and a second ground via 233G for electrically connecting the second ground pattern 223G and the third ground pattern 225G. The third conductive vias 235G, 235R, and 235T may include 3-1 sensing vias 235R for electrically connecting the 2-1 sensing pads 223R and the first sensing patterns 225R, 3-2 sensing vias 235T for electrically connecting the 2-2 sensing pads 223T and the 3-2 sensing pads 225T, and a third ground via 235G for electrically connecting the second ground pattern 223G and the third ground pattern 225G.

The second conductive vias 233G, 233R, and 233T may be in contact with the second conductive layer 223G, 223R, and 223T, the third conductive vias 235G, 235R, and 235T may be in contact with the third conductive layer 225G, 225R and 225T, and the second conductive vias 233G, 233R, and 233T and the third conductive vias 235G, 235R and 235T may be in contact with each other. Specifically, the 2-1 sensing pads 223R and the first sensing patterns 225R may be electrically connected to each other by the 2-1 sensing vias 233R and the 3-1 sensing vias 235R, which may be vertically connected. The 2-2 sensing pads 223T and the 3-2 sensing pads 225T may be electrically connected to each other by 2-2 sensing vias 233T and the 3-2 sensing vias 235T, which may be vertically connected, and the second ground pattern 223G and the third ground pattern 225G may be electrically connected to each other by the second ground via 233G and the third ground via 235G, which may be vertically connected.

In example embodiments, each of the second conductive vias 233G, 233R, and 233T and the third conductive vias 235G, 235R, and 235T may have a tapered structure in which a horizontal width decreases toward a center in a thickness direction of the base layer 211. In some embodiments, the second conductive vias 233G, 233R, and 233T and the third conductive vias 235G, 235R, and 235T may have a minimum horizontal width on a contact surface therebetween.

The fourth conductive vias 237T and 237G may include 4-2 sensing vias 237T for electrically connecting the 3-2 sensing pads 225T and the second sensing patterns 227T, and a fourth ground via 237G for electrically connecting the third ground pattern 225G and the fourth ground pattern 227G. In example embodiments, the fourth conductive vias 237T and 237G may have a tapered structure in which a horizontal width decreases toward the base layer 211.

Referring to FIG. 2A, the second substrate 200 may include a sensing region SR, a first contact region CR1, a second contact region CR2, a third contact region CR3, a wiring region YR, and a peripheral region ER. Specifically, the sensing region SR may be a region in which the first and second sensing patterns 225R and 227T for fingerprint recognition are disposed. Referring to FIG. 2C, the first contact region CR1 and the third contact region CR3 may be regions in which the 1-1 sensing vias 231R, the 2-1 sensing vias 233R, and the 3-1 sensing vias 235R, for connecting the first sensing patterns 225R and the controller chip 310, are disposed. Referring to FIG. 2D, the second contact region CR2 may be a region in which the 1-2 sensing vias 231T, the 2-2 sensing vias 233T, the 3-2 sensing vias 235T, and the 4-2 sensing vias 237T, for connecting the second sensing patterns 227T and the controller chip 310, may be disposed. The wiring region YR may be a region in which at least a portion of the first to fourth ground vias 231G, 233G, 235G, and 237G for connecting the fourth ground pattern 227G and the controller chip 310 are disposed.

Referring to FIGS. 2A and 2E, the sensing region SR may be disposed in a central portion of the second substrate 200. In some embodiments, the sensing region SR may have a rectangular or square shape, when viewed from a plan view. A plurality of first sensing patterns 225R, having a linear shape, spaced apart in the first direction (the X-direction), and extending in the second direction (the Y-direction), and a plurality of second sensing patterns 227T, having a linear shape, spaced apart in the second direction (the Y-direction), extending in the first direction (the X-direction), may be disposed in the sensing region SR.

The first contact region CR1 may be formed on one end or side of the sensing region SR in the second direction (the Y-direction), and the third contact region CR3 may be formed on the other end or side of the sensing region SR in the second direction (the Y-direction). In addition, the second contact region CR2 may be formed on one end or side of the sensing region SR in the first direction (the X-direction), and the wiring region YR may be formed on the other end or side of the sensing region SR in the first direction (the X-direction).

The peripheral region ER may be disposed in an outer portion of the second substrate 200. The peripheral region ER may surround the sensing region SR in a plan view. The second bonding pads 221B may be disposed in the peripheral region ER. In the peripheral region ER, the first to fourth ground patterns 221G, 223G, 225G, and 227G for providing a reference potential and shielding sensing noise may be at least partially disposed.

The first sensing patterns 225R may extend between the sensing region SR and the first contact region CR1 or between the sensing region SR and the third contact region CR3. The first sensing patterns 225R may be connected to the controller chip 310 through the 1-1 sensing vias 231R, the 2-1 sensing vias 233R, and the 3-1 sensing vias 235R, disposed in the first and third contact regions CR1 and CR3. In the first contact region CR1, each of the 1-1 sensing vias 231R, the 2-1 sensing vias 233R, and the 3-1 sensing vias 235R may be arranged in the first direction (the X-direction). In addition, in the third contact region CR3, each of the 1-1 sensing vias 231R, the 2-1 sensing vias 233R, and the 3-1 sensing vias 235R may be arranged in the first direction (the X-direction). Some of the first sensing patterns 225R may be connected to the 1-1 sensing vias 231R, the 2-1 sensing vias 233R, and the 3-1 sensing vias 235R, disposed in the first contact region CR1. In addition, other portions of the first sensing patterns 225R may be connected to the 1-1 sensing vias 231R, the 2-1 sensing vias 233R, and the 3-1 sensing vias 235R, disposed in the third contact region CR3. Neighboring first sensing patterns 225R may be electrically separated.

The second sensing patterns 227T may extend within the sensing region SR and the second contact region CR2. The second sensing patterns 227T may be connected to the controller chip 310 through the 1-2 sensing vias 231T, the 2-2 sensing vias 233T, the 3-2 sensing vias 235T, and the 4-2 sensing vias 237T, disposed in the second contact region CR2. Each of the 1-2 sensing vias 231T, the 2-2 sensing vias 233T, the 3-2 sensing vias 235T, and the 4-2 sensing vias 237T may be arranged staggered in a zigzag pattern in the second direction (the Y-direction).

The first sensing patterns 225R may have a first width W1 in the first direction (the X-direction), and the second sensing patterns 227T may have a second width W2 in the second direction (the Y-direction). In some embodiments, the first width W1 may be wider than the second width W2. For example, the first width W1 may have a range of about 2 times to about 4 times the second width W2. Specifically, the first width W1 may have a range of about 40 μm to about 70 μm, and the second width W2 may have a range of about 5 μm to about 25 μm.

A portion in which the first sensing patterns 225R and the second sensing patterns 227T overlap in the third direction (the Z-direction) may constitute pixels PX. A first pitch or spacing PIX in the first direction (the X-direction) between centers PXC of the pixels PX may be substantially the same as a second pitch or spacing PIY in the second direction (the Y-direction) between the centers PXC of the pixels PX, but is not limited thereto. For example, each of the first pitch PIX and the second pitch PIY may have a range of about 50 μm to about 90 μm.

The pixels PX may have a composite capacitance value of area capacitance AC by the first sensing patterns 225R and the second sensing patterns 227T, overlapping each other, and fringing capacitance by the first sensing patterns 225R and the second sensing patterns 227T.

When the user's fingerprint comes into contact with the upper surface 200U of the second substrate 200, a capacitance value corresponding to each of the pixels PX may be changed by capacitance induced between the second sensing patterns 227T and the user's fingerprint. Since the change in capacitance value is determined according to a shape of the user's fingerprint, the controller chip 310 may identify the user's fingerprint from the change in capacitance value of the pixels PX.

The fourth ground pattern 227G may planarly surround the sensing region SR on which the second sensing patterns 227T is disposed. The fourth ground pattern 227G may be located on the same vertical level as the second sensing patterns 227T, and may planarly surround the second sensing patterns 227T. For example, the fourth ground pattern 227G may continuously extend along an edge of the sensing region SR on an upper surface of the upper insulating layer 215, to planarly surround the second sensing patterns 227T. The fourth ground pattern 227G may be disposed around the sensing region SR while the user's fingerprint is in contact with the sensing region SR, to reduce sensing noise.

The base layer 211 may include an insulating material. The base layer 211 may include a resin and a glass fiber. The resin included in the base layer 211 may be at least one selected from a phenol resin, an epoxy resin, and polyimide. In some embodiments, the base layer 211 may include at least one material selected from flame retardant 4 (FR4), tetrafunctional epoxy, polyphenylene ether, epoxy/polyphenylene oxide, a thermount, bismaleimide triazine (BT), cyanate ester, polyimide, a prepreg, an Ajinomoto build-up film (ABF), and a liquid crystal polymer. In other embodiments, the base layer 211 may include silicon oxide, silicon nitride, silicon oxynitride, or a combination thereof. The glass fiber included in the base layer 211 may be a reinforcing material, and may be a glass filament obtained by melt-spinning a glass material at a high temperature and then treating the same by a convergence process. The glass filament may be a processed ore product containing silica as a main component.

Hereinafter, for convenience of description and understanding, components of the second substrate 200 will be described in order of closer distance to the base layer 211.

The second conductive layers 223G, 223R, and 223T may include 2-1 sensing pads 223R, 2-2 sensing pads 223T, and a second ground pattern 223G to which a reference potential is applied. The second ground pattern 223G may be disposed in the sensing region SR, the wiring region YR, and the peripheral region ER. A portion of the second ground pattern 223G may overlap the first sensing patterns 225R and the second sensing patterns 227T in the third direction (the Z-direction). A portion of the second ground pattern 223G may be interposed between the second sensing patterns 227T and the controller chip 310. Therefore, the second ground pattern 223G may block external sensing noise from the controller chip 310. The 2-1 sensing pads 223R may be disposed on the first and third contact regions CR1 and CR3, and the 2-2 sensing pads 223T may be disposed on the second contact region CR2. The 2-1 sensing pads 223R may provide a path for electrical connection between the first sensing patterns 225R and the controller chip 310, and the 2-2 sensing pads 223T may provide a path for electrical connection between the second sensing patterns 227T and the controller chip 310.

The lower insulating layer 213 may be disposed on the lower surface of the base layer 211 to at least partially cover or surround the second conductive layers 223G, 223R, and 223T. The lower insulating layer 213 may electrically separate the 2-1 sensing pads 223R, the 2-2 sensing pads 223T, and the second ground pattern 223G from each other.

The third conductive layers 225G, 225R, and 225T may include a third ground pattern 225G to which a reference potential is applied, first sensing patterns 225R for recognizing a user's fingerprint, and 3-2 sensing pads 225T. The first sensing patterns 225R may be disposed in the sensing region SR, the third ground pattern 225G may be disposed in the wiring region YR and the peripheral region ER, and the 3-2 sensing pads 225T may be disposed in the second contact region CR2. The 3-2 sensing pads 225T may provide a path for electrical connection between the second sensing patterns 227T and the controller chip 310.

The upper insulating layer 215 may be disposed on the upper surface of the base layer 211 to at least partially cover or surround the third conductive layers 225G, 225R, and 225T. The upper insulating layer 215 may electrically separate the first sensing patterns 225R, the 3-2 sensing pads 225T, and the third ground pattern 225G from each other.

The lower insulating layer 213 and the upper insulating layer 215 may include different materials. For example, the upper insulating layer 215 may include a material having a permittivity suitable for fingerprint recognition of the fingerprint sensor package 10. However, the materials of the lower insulating layer 213 and the upper insulating layer 215 are not limited thereto, and the lower insulating layer 213 and the upper insulating layer 215 may include the same material.

Each of the lower insulating layer 213 and the upper insulating layer 215 may include at least one selected from a phenol resin, an epoxy resin, and polyimide. In some embodiments, each of the lower insulating layer 213 and the upper insulating layer 215 may include at least one selected from a prepreg, FR4, tetragonal epoxy, polyphenylene ether, epoxy/polyphenylene oxide, a thermount, BT, cyanate ester, polyimide, and a liquid crystal polymer.

The fourth conductive layers 227G and 227T may be disposed on the upper surface of the upper insulating layer 215. The fourth conductive layers 227G and 227T may include a fourth ground pattern 227G for removing sensing noise and second sensing patterns 227T for recognizing a user's fingerprint. The second sensing patterns 227T may be disposed in the sensing region SR, and the fourth ground pattern 227G may be disposed in the peripheral region ER.

The second sensing patterns 227T may be spaced apart from the first sensing patterns 225R in the third direction (the Z-direction), with the upper insulating layer 215 interposed therebetween. For example, the second sensing patterns 227T may be electrically insulated from the first sensing patterns 225R by the upper insulating layer 215. Therefore, the first sensing patterns 225R may constitute a first electrode of a capacitor, the upper insulating layer 215 may constitute a dielectric layer of the capacitor, and the second sensing patterns 227T may constitute a second electrode of the capacitor. For example, capacitors constituting the fingerprint sensor may be formed in the second substrate 200.

The upper protective layer 219 may be disposed on the upper surface of the upper insulating layer 215 to cover the fourth conductive layers 227G and 227T.

The first conductive layers 221B, 221G, 221R, 221T, and 221P may be disposed on the lower surface of the lower insulating layer 213. The first conductive layers 221B, 221G, 221R, 221T, and 221P may include second bonding pads 221B, 1-1 sensing pads 221R, 1-2 sensing pads 221T, a power pattern 221P, and a first ground pattern 221G to which a reference potential is applied.

The second bonding pads 221B may be directly or indirectly bonded and electrically connected to the first bonding pads 120 of the first substrate 100. For example, the second bonding pads 221B may include at least one selected from tin (Sn), gold (Au), and alloys thereof. The second bonding pads 221B may be formed at positions corresponding to the first bonding pads 120 and in sizes corresponding to each other. The second bonding pads 221B may include a power pad to which power (e.g., power supply potential) provided from an external device is applied, ground pads to which reference potential is applied, and an output pad for outputting a fingerprint recognition result of the fingerprint sensor package 10 externally (e.g., to the display unit 12 of the smart card 1 of FIG. 1). The controller chip 310 may receive power potential through some of the second bonding pads 221B and the power pattern 221P, and may receive reference potential through some of the second bonding pads 221B and the first ground pattern 221G. In addition, the controller chip 310 may receive a signal recognized by the first and second sensing patterns 225R and 227T through the 1-1 sensing pads 221R and the 1-2 sensing pads 221T.

The 1-1 sensing pads 221R may extend from the first and third contact regions CR1 and CR3 to a portion overlapping the controller chip 310 in the third direction (the Z-direction), and the 1-2 sensing pads 221T may extend from the second contact region CR2 to a portion overlapping the controller chip 310 in the third direction (the Z-direction). The 1-1 sensing pads 221R may provide a path for electrical connection between the first sensing patterns 225R and the controller chip 310, and the 1-2 sensing pads 221T may provide a path for electrical connection between the second sensing patterns 227T and the controller chip 310.

The lower protective layer 217 may be disposed on the lower surface of the lower insulating layer 213 to cover or surround at least a portion of the first conductive layers 221B, 221G, 221R, 221T, and 221P. In some example embodiments, the lower protective layer 217 may be formed to cover a region of the lower surface of the lower insulating layer 213. In other example embodiments, the lower protective layer 217 may be formed to entirely cover the lower surface of the lower insulating layer 213.

Each of the lower protective layer 217 and the upper protective layer 219 may be an insulating coating layer. In some embodiments, the lower protective layer 217 and the upper protective layer 219 may be formed as a solder resist. In other embodiments, the lower protective layer 217 and the upper protective layer 219 may include a polymer material having excellent heat resistance, insulation, and hardness. For example, each of the lower protective layer 217 and the upper protective layer 219 may be formed of polyimide, polyamide, polyacetal, polycarbonate, or the like. In some embodiments, the upper protective layer 219 may include a material having permittivity suitable for fingerprint recognition (e.g., a high dielectric material).

Referring to FIGS. 2A and 2C, the conductive support 340 may electrically connect the first bonding pads 120 of the first substrate 100 and the second bonding pads 221B of the second substrate 200 to each other, and may support the first substrate 100 and the second substrate 200, spaced apart from each other, from below to maintain electrical connection of the first substrate 100 and the second substrate 200, even when an external force is applied to the upper surface 200U of the second substrate 200.

The conductive support 340 may have a predetermined thickness and a predetermined width, and may be formed to have a rectangular shape elongated in one direction. However, the inventive concept is not limited thereto, and the conductive support 340 may be modified to have various shapes. For example, when the first bonding pads 120 and the second bonding pads 221B may be located on the same vertical level, the conductive support 340 may be formed to have a bar shape. When the first bonding pads 120 and the second bonding pads 221B are located on different vertical levels, in the conductive support 340, one portion thereof may be formed to be thicker than a thickness of any other portion thereof to compensate for a difference in vertical levels. In addition, when viewed from the top, a portion of the conductive support 340 may have a wider width than any other portion of the conductive support 340.

The conductive support 340 may include a material having high electrical conductivity. For example, the conductive support 340 may include a metal material such as copper (Cu) or aluminum (Al). In addition, the conductive support 340 may maintain an original shape thereof even when an external force is applied, and may firmly support the first substrate 100 and the second substrate 200. To this end, the conductive support 340 may be formed of a material having high rigidity.

The conductive support 340 may be bonded to the first bonding pads 120 and the second bonding pads 221B through a conductive member 342. For example, the conductive member 342 may be a solder bump, but is not limited thereto, and, for example, a conductive epoxy such as silver epoxy or an anisotropic conductive film (ACF) may be used as the conductive member 342. A groove 341 may be formed on an upper surface of the conductive support 340 to limit a position to which the conductive member 342 is attached.

The controller chip 310 and the passive element 320 may be disposed on the lower surface 200B of the second substrate 200. The controller chip 310 may be mounted on the lower surface 200B of the second substrate 200 in a flip chip manner. Connection bumps 315 for electrically and physically connecting the controller chip 310 and the second substrate 200 may be disposed between the controller chip 310 and the second substrate 200. The connection bumps 315 may be disposed between some patterns of the first conductive layers 221B, 221G, 221R, 221T, and 221P and chip pads 311 of the controller chip 310.

In some embodiments, the controller chip 310 may be entirely or partially disposed within the sensing region SR. In other embodiments, the controller chip 310 may be entirely disposed outside the sensing region SR. The controller chip 310 may include any component configured to perform an operation for recognizing a user's fingerprint from changes in capacitance values of the pixels PX, such as a memory chip and/or a processor chip. In addition, the passive element 320 may include, for example, a multilayer ceramic capacitor (MLCC), but is not limited thereto.

The molding layer 350 may be disposed on the first substrate 100 and the second substrate 200 to cover the controller chip 310, the conductive support 340, and the passive element 320. The molding layer 350 may be in or fill a space between the sidewall of the through-hole 110H and the sidewall of the second substrate 200. The molding layer 350 may serve to protect the second substrate 200, the controller chip 310, and the passive element 320 from external influences such as contamination, impact, or the like. An upper surface 350U of the molding layer 350 may be formed to be substantially coplanar with the upper surface 100U of the first substrate 100 and the upper surface 200U of the second substrate 200. However, the inventive concept is not limited thereto, and according to embodiments, the upper surface 350U of the molding layer 350 may be formed concavely due to a meniscus generated during a manufacturing process. The molding layer 350 may have a central portion thicker than edges. For example, a lower surface 350B of the molding layer 350 may be formed to be convex.

In addition, the molding layer 350 may at least partially cover or surround the first bonding pads 120 disposed on the second surface 113 of the core insulating layer 110, but may not cover the external connection pads 130 to be exposed externally. The molding layer 350 may be extended along a boundary between a region in which the first bonding pads 120 are disposed and a region in which the external connection pads 130 are disposed, on the second surface 113 of the core insulating layer 110. The molding layer 350 may extend laterally from a side surface of the second substrate 200 to at least partially cover or surround the first bonding pad 120, but may be spaced apart from the external connection pads 130. The molding layer 350 may be formed to cover a second distance D2 from the through-hole 110H of the first substrate 100. For example, the second distance D2 may have a range of about 0.1 mm to about 3.0 mm.

The molding layer 350 may be formed of an epoxy molding compound. Alternatively, the molding layer 350 may be formed of an epoxy-based material, a thermosetting material, a thermoplastic material, a UV treated material, or the like.

In a fingerprint sensor package 10 according to an embodiment, the first bonding pads 120 of the first substrate 100 may be connected to the second bonding pads 221B of the second substrate 200 by the conductive support 340. Therefore, compared to a case in which the first bonding pads 120 and the second bonding pads 221B are connected using a conductive wire, even when mechanical stress is repeatedly applied to the second substrate 200, electrical connection between the first substrate 100 and the second substrate 200 may not be damaged. Therefore, reliability of the fingerprint sensor package 10 may be improved.

Figure 3A:
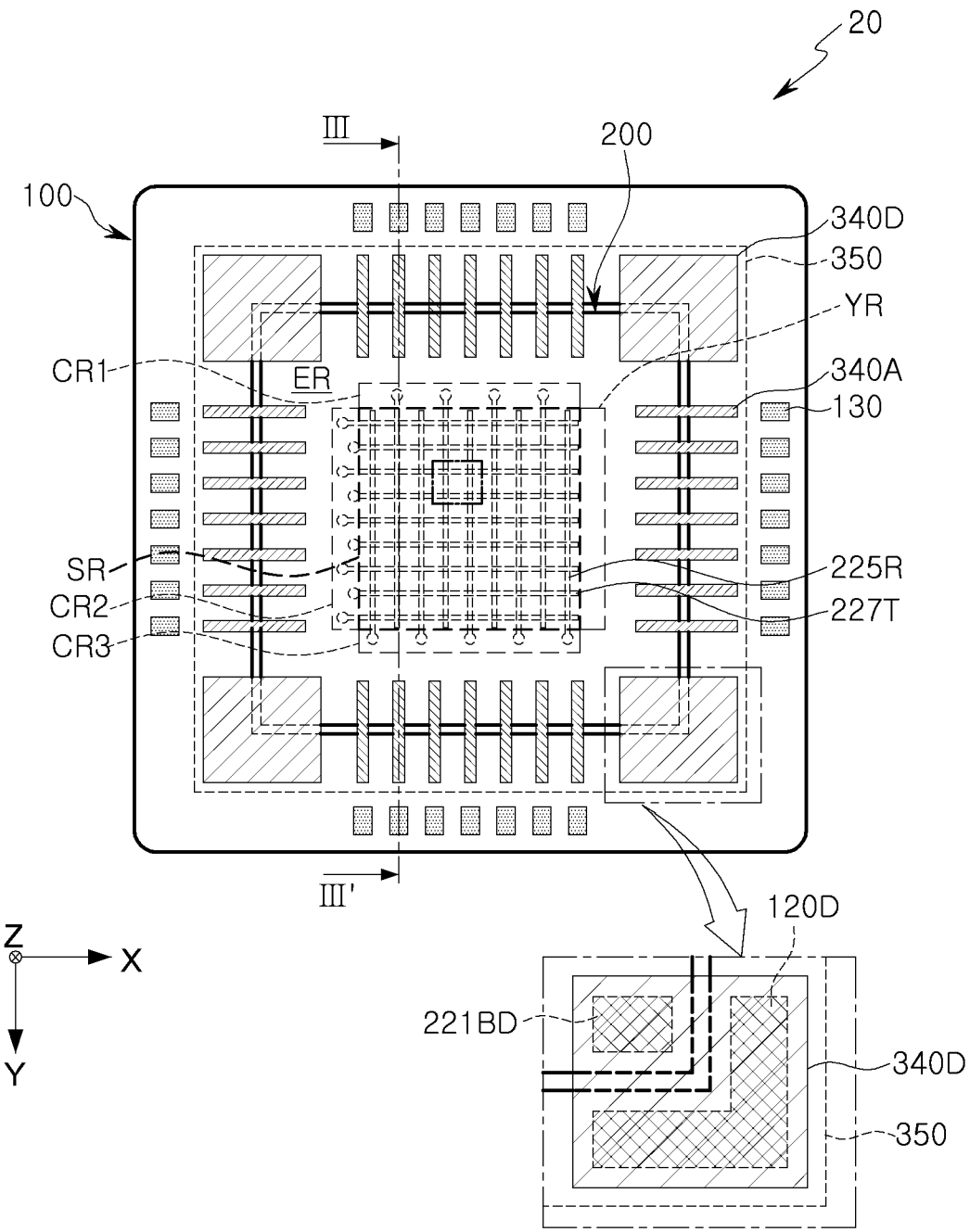
FIGS. 3A to 3C are views illustrating a fingerprint sensor package according to an embodiment.
Figure 3B:
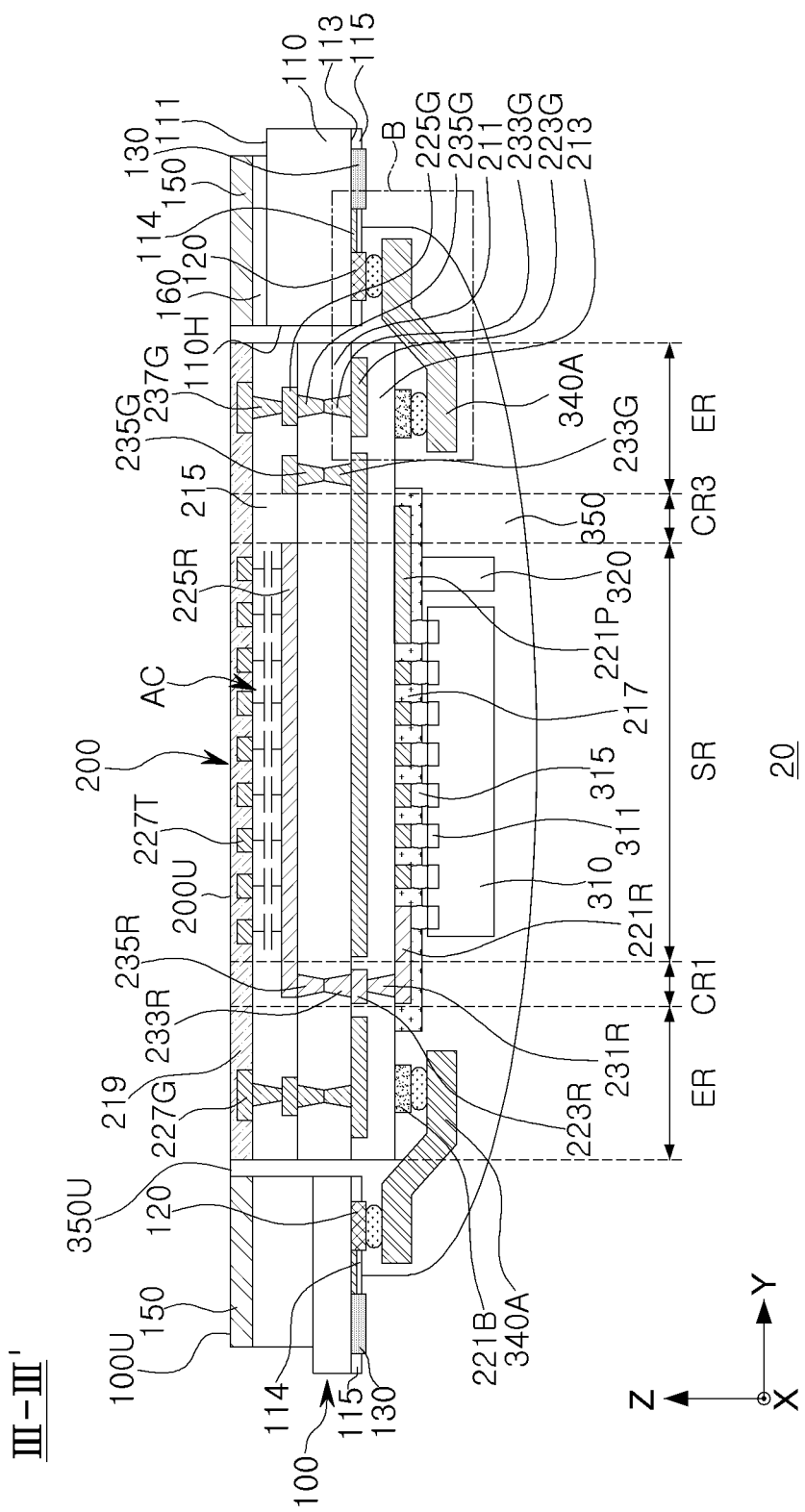
Figure 3C:
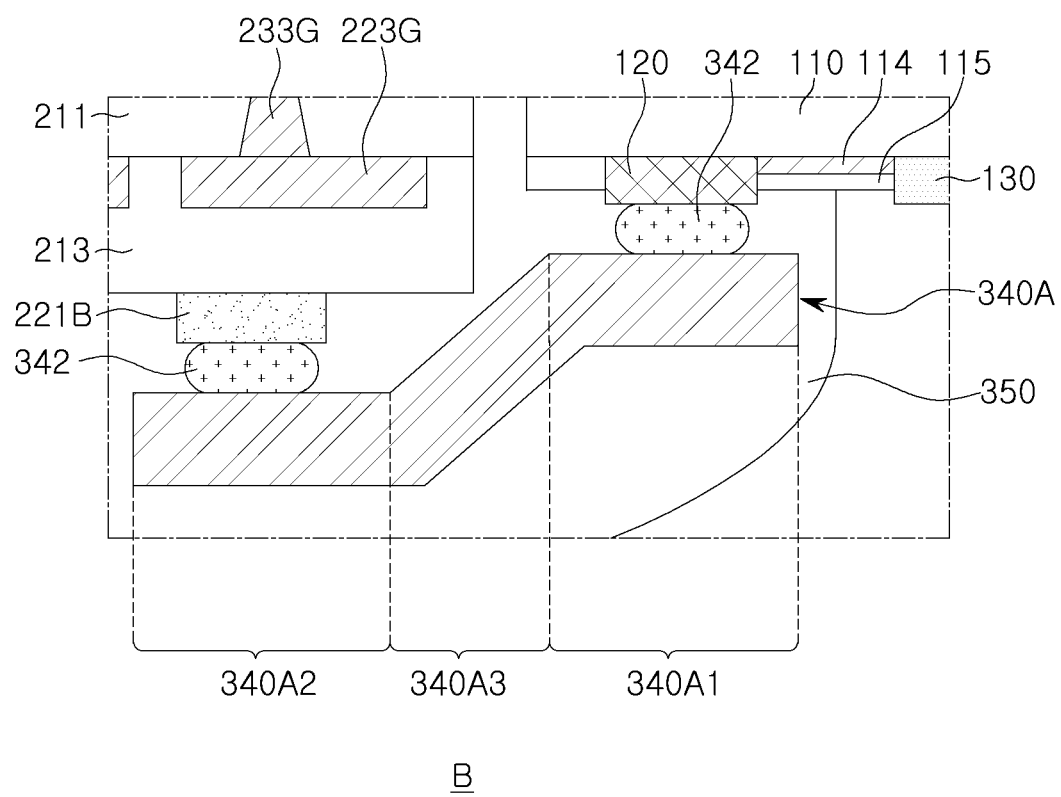

FIGS. 3A to 3C are views illustrating a fingerprint sensor package according to an embodiment. Specifically, FIG. 3A is a bottom view schematically illustrating a layout of some components of a fingerprint sensor package 20, FIG. 3B is a cross-sectional view of FIG. 3A, taken along line III-III', and FIG. 3C is an enlarged view of portion "B" in FIG. 3B.

A fingerprint sensor package 20 illustrated in FIGS. 3A to 3C may be substantially the same as or similar to the fingerprint sensor package 10 described with reference to FIGS. 2A to 2E, except that a conductive support 340A has a bent shape and a dummy support 340D is further included. Hereinafter, a fingerprint sensor package 20 according to an embodiment will be described, focusing on differences from the fingerprint sensor package 10 described with reference to FIGS. 2A to 2E.

Referring to FIG. 3A, a fingerprint sensor package 20 according to an example embodiment may further include a dummy support 340D connecting a first substrate 100 and a second substrate 200 to each other.

The dummy support 340D may be disposed around a conductive support 340A to connect the first substrate 100 and the second substrate 200 to each other. The dummy support 340D may support the first substrate 100 and the second substrate 200 more firmly by supporting the first substrate 100 and the second substrate 200 spaced apart from each other from below. Depending on an embodiment, when viewed from the bottom, an area of the dummy support 340D may be formed to be larger than an area of the conductive support 340A, to more firmly support the first substrate 100 and the second substrate 200.

The dummy support 340D may be disposed to overlap the first substrate 100 at or in each outer corner region of the second substrate 200. The dummy support 340D may be attached to connect first dummy bonding pads 120D of the first substrate 100 and second dummy bonding pads 221BD of the second substrate 200. Depending on an embodiment, at least one of the first dummy bonding pads 120D and at least one of the second dummy bonding pads 221BD may be electrically grounded.

The dummy support 340D may be formed of a material having high rigidity. The dummy support 340D may be formed of the same material as the conductive support 340A, but depending on embodiments, the dummy support 340D may be formed of a material different from that of the conductive support 340A. Depending on an example embodiment, the dummy support 340D may be formed of a material having high rigidity or not having high electrical conductivity.

Referring to FIGS. 3B and 3C, a conductive support 340A of an embodiment may have a bent shape when viewed from the side. The conductive support 340A may have first to third regions 340A1, 340A2, and 340A3 to compensate for a difference in vertical level between first bonding pads 120 and second bonding pads 221B. The first region 340A1 and the second region 340A2 may be disposed on a vertical level capable of being connected to the first bonding pads 120 and the second bonding pads 221B through a conductive member 342, respectively. The third region 340A3 may be inclined and may be between or connect the first and second regions 340A1, 340A2.

Figure 4:
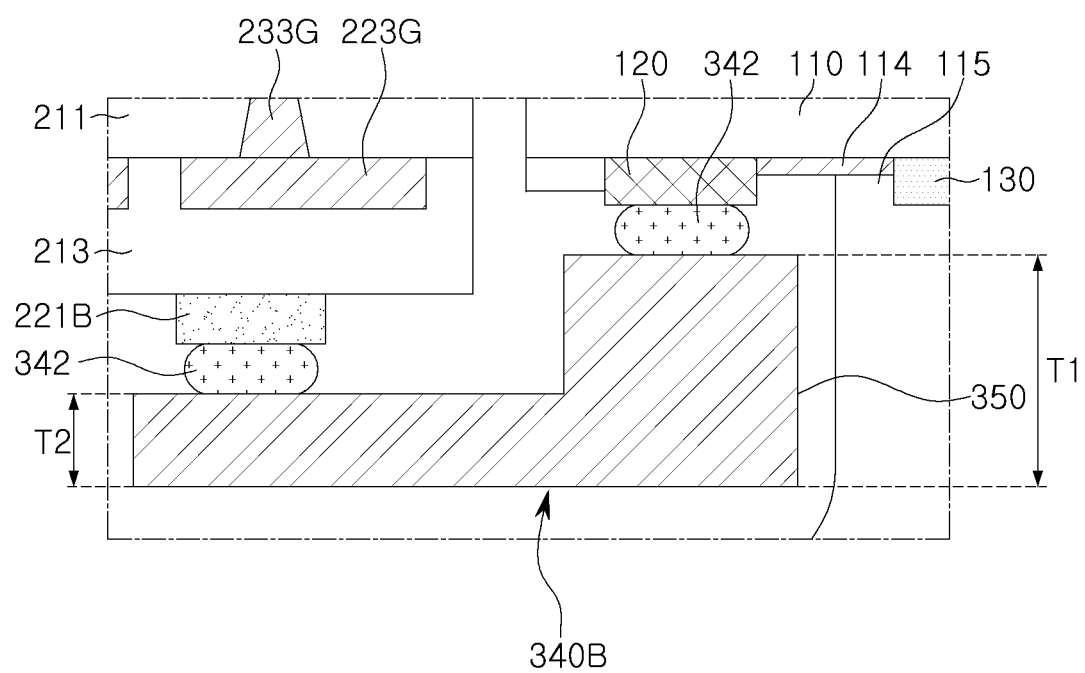
FIG. 4 is a cross-sectional view illustrating a modified example of the conductive support illustrated in FIG. 3C.

FIG. 4 is a cross-sectional view illustrating a modified example of the conductive support 340A illustrated in FIG. 3C. The conductive support 340A of FIG. 3C described above may be bent to compensate for the difference in vertical level between the first bonding pads 120 and the second bonding pads 221B. In a conductive support 340B of FIG. 4, one portion thereof may be formed to be thicker than a remaining portion thereof, to compensate for a difference in vertical level between first bonding pads 120 and second bonding pads 221B. For example, in the conductive support 340B, a thickness T1 of a region corresponding to the first bonding pads 120 may be thicker than a thickness T2 of a region corresponding to the second bonding pads 221B.

Figure 5A:
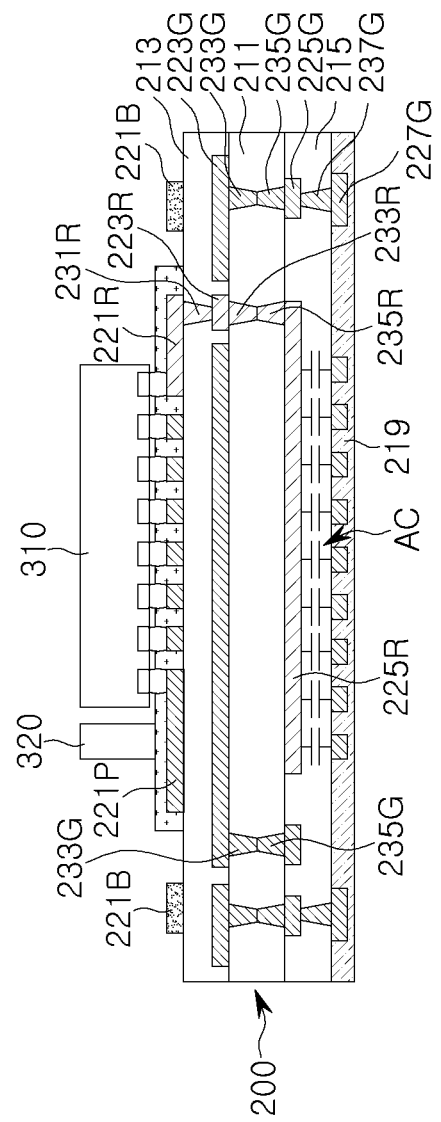
Figure 5C:
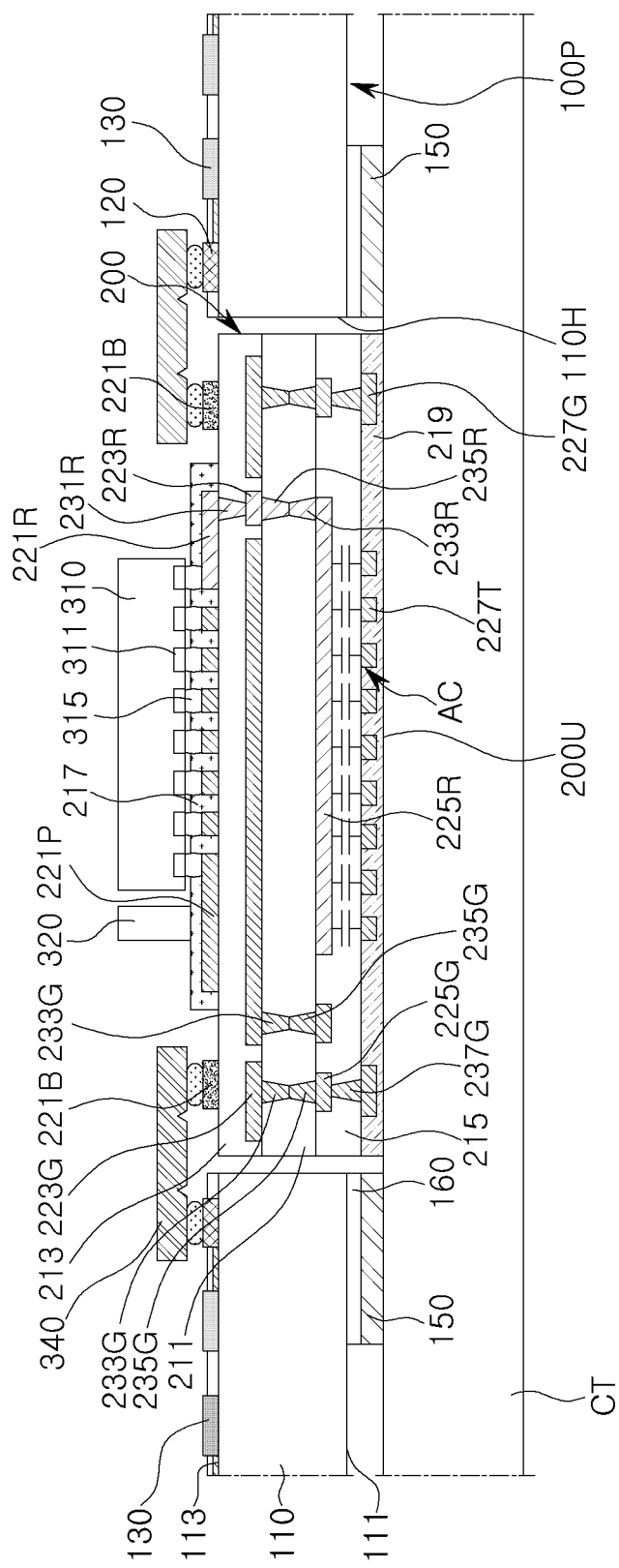
Figure 5D:
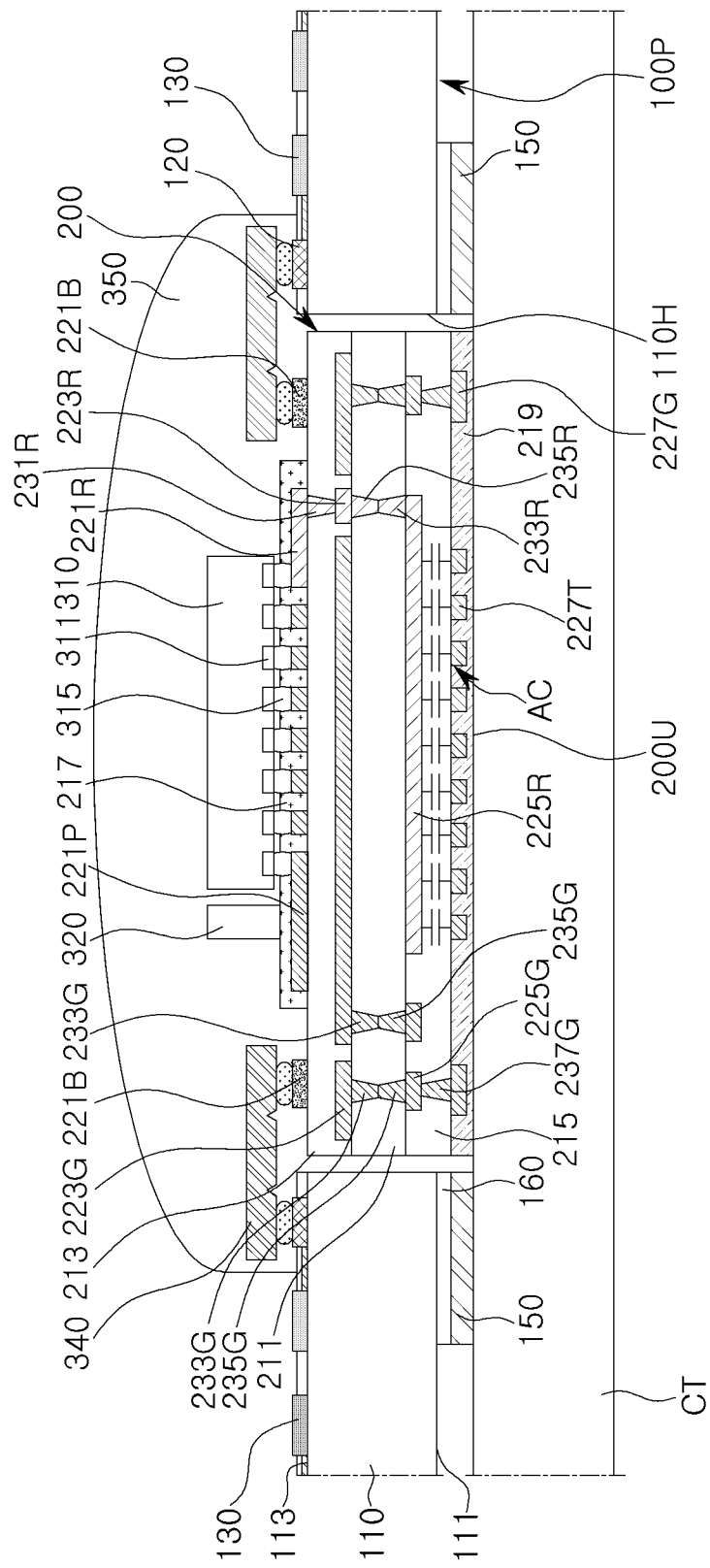
Figure 5E:
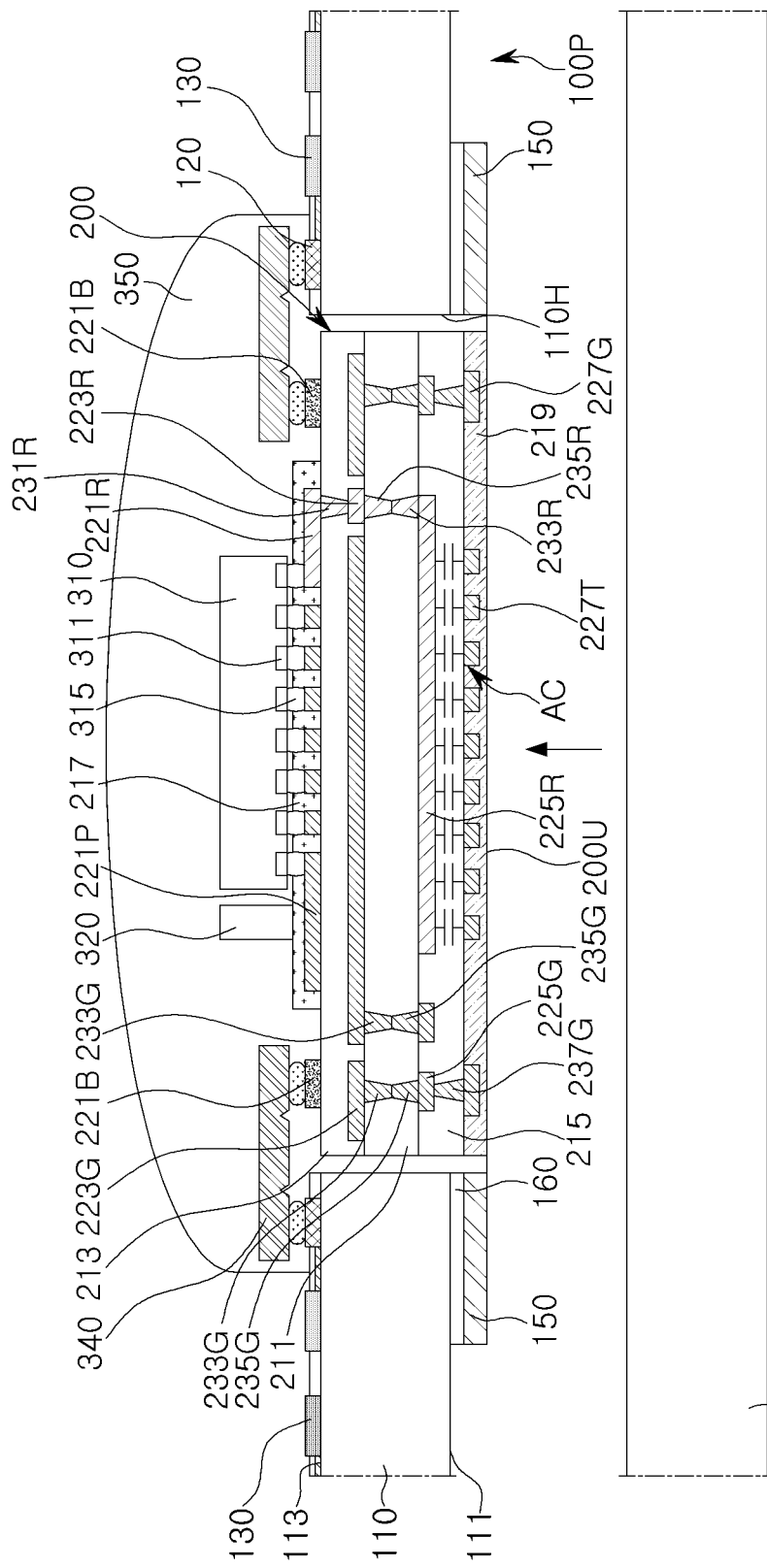
Figure 5F:
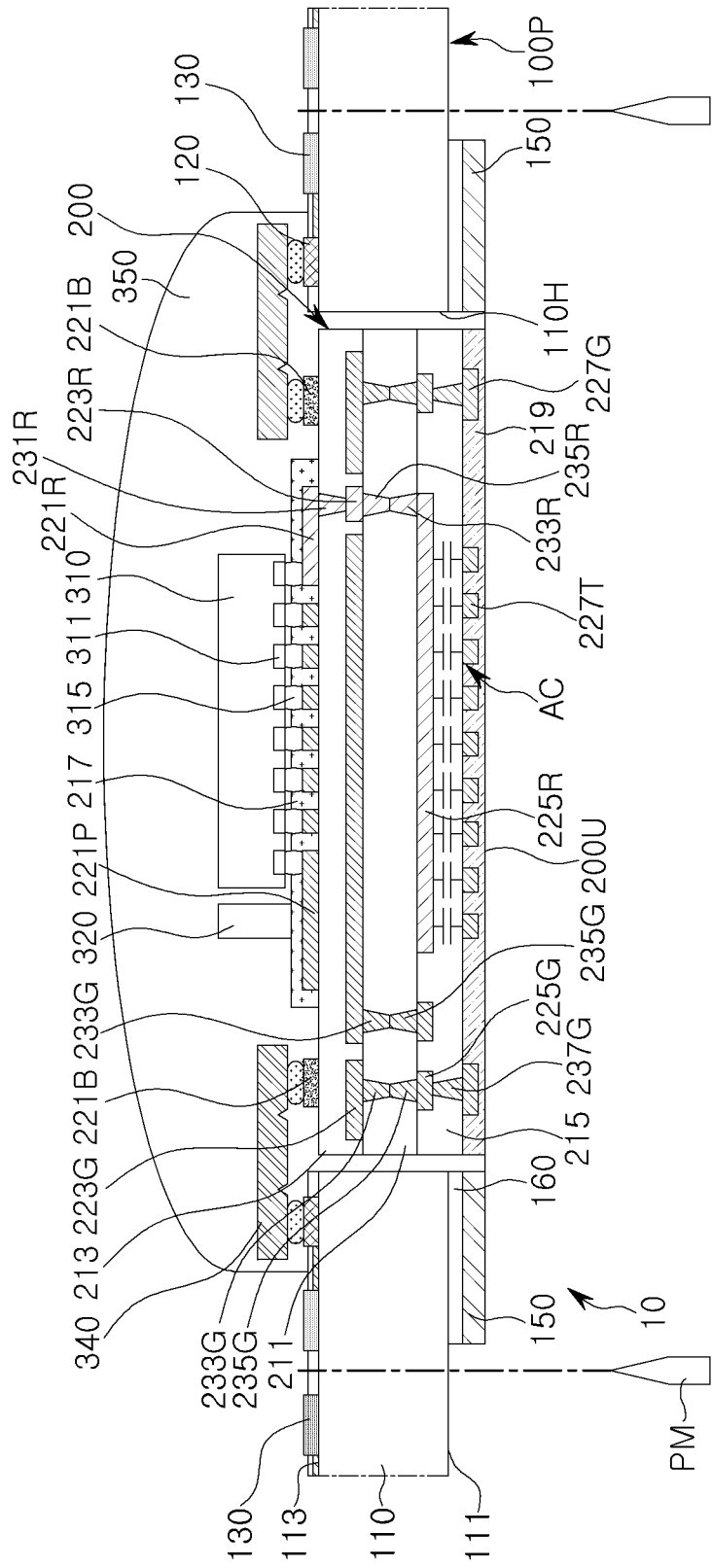
Figure 5G:
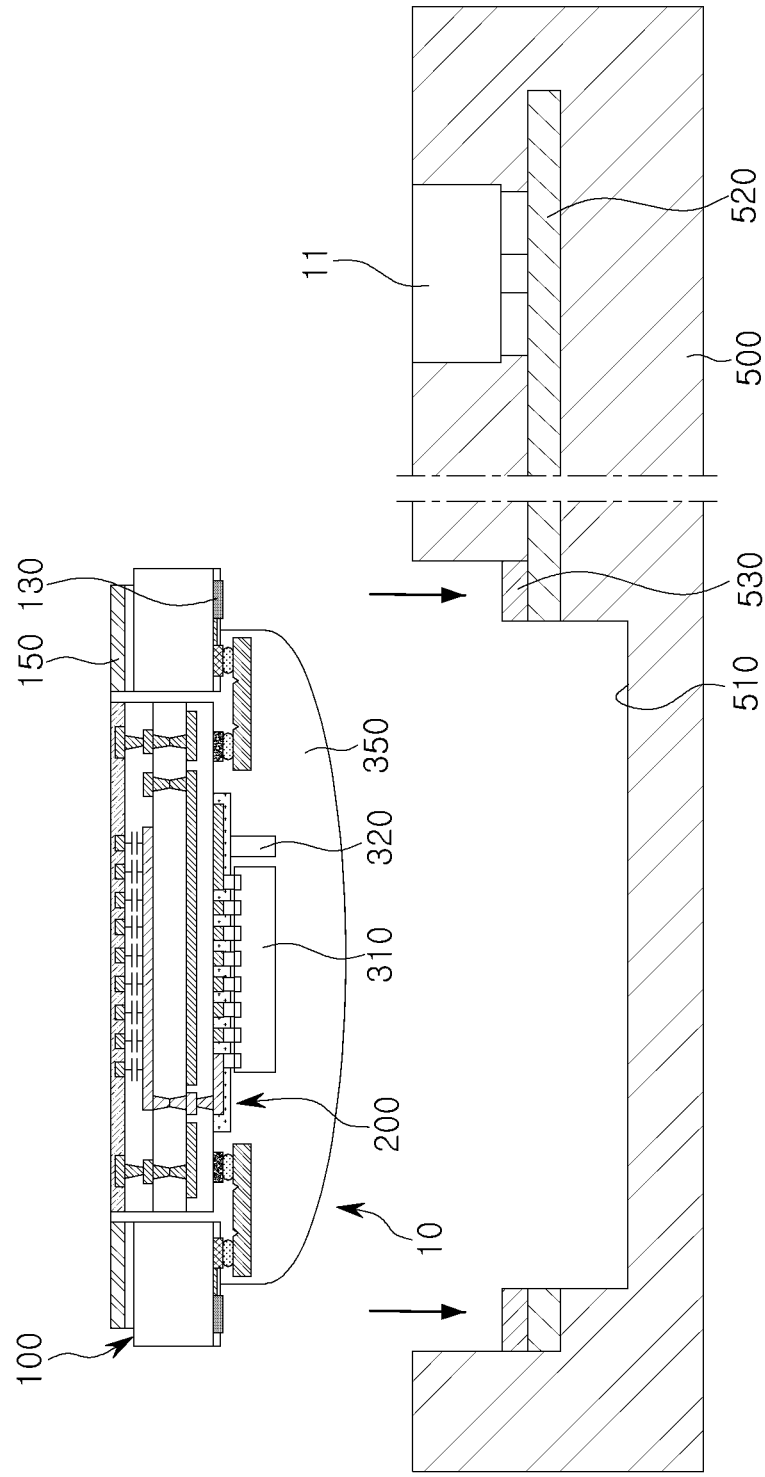
Figure 5H:
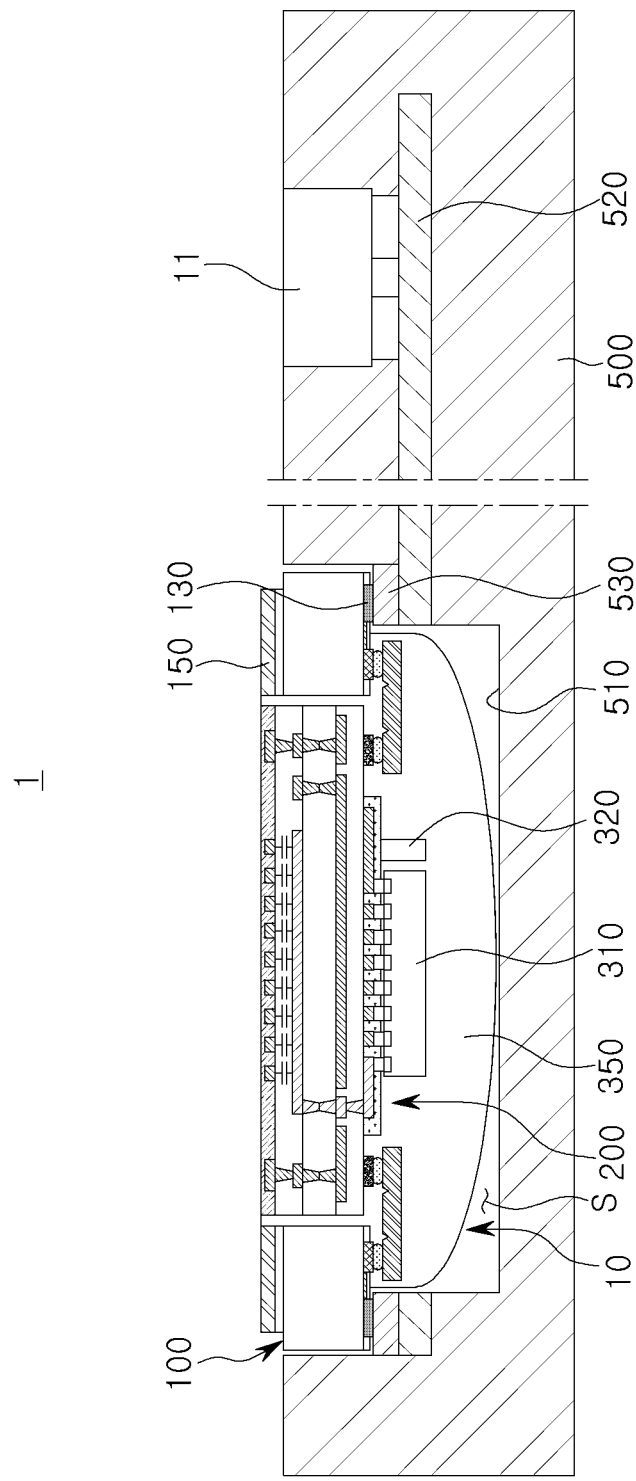

FIGS. 5A to 5H are views illustrating a method of manufacturing a smart card in a process sequence according to an embodiment. Specifically, FIGS. 5A to 5F are processes for manufacturing a fingerprint sensor package mounted on a smart card, and FIGS. 5G and 5H are processes for manufacturing a smart card by mounting the fingerprint sensor package on a card body.

Referring to FIG. 5A, a second substrate 200 may be prepared, and a controller chip 310 and a passive element 320 may be mounted on the second substrate 200. The controller chip 310 may be mounted on the second substrate 200 using a flip chip method.

Referring to FIG. 5B, a first panel substrate 100P on which the second substrate 200 is to be mounted may be prepared. Most of the components and materials constituting the first panel substrate 100P may be substantially the same as or similar to those of the first substrate 100 of the fingerprint sensor package 10 described above with reference to FIGS. 2A to 2E. The first panel substrate 100P may have a larger planar area than the first substrate 100 such that a plurality of second substrates 200 are mounted thereon. The first panel substrate 100P may be mounted on a winding reel facility, and reeling and releasing of the first panel substrate 100P may be controlled by the winding reel facility. The first panel substrate 100P may be provided in a state in which a through-hole 110H is formed and a carrier tape CT is attached to a rear surface. The carrier tape CT may be for temporarily fixing the second substrate 200 in a subsequent process.

Referring to FIG. 5C, the second substrate 200 may be disposed in the through-hole 110H of the first panel substrate 100P. The second substrate 200 may be fixed in the through-hole 110H by being attached to the carrier tape CT exposed on a lower surface of the through-hole 110H of the first panel substrate 100P. After disposing the second substrate 200 in the through-hole 110H of the first panel substrate 100P, a conductive support 340 for electrically connecting the first panel substrate 100P and the second substrate 200 may be attached. The conductive support 340 may be connected to a first bonding pad 120 of the first panel substrate 100P and a second bonding pad 221B of the second substrate 200 through a conductive member 342.

Referring to FIG. 5D, a molding layer 350 may be formed on a second surface 113 of a core insulating layer 110. The molding layer 350 may at least partially cover the first panel substrate 100P, the controller chip 310, the conductive support 340, and the passive element 320. The molding layer 350 may be configured to flow into the through-hole 110H of the first panel substrate 100P and at least partially cover a side surface of the through-hole 110H and an upper surface of the second substrate 200. Also, the molding layer 350 may be formed not to cover an external connection pad 130 of the first panel substrate 100P.

Referring to FIG. 5E, the carrier tape CT may be removed from the first panel substrate 100P.

Referring to FIG. 5F, the first panel substrate 100P may be cut using a punching facility or punching mechanism PM. The punching facility PM may cut the first panel substrate 100P to form a fingerprint sensor package 10, as described in FIGS. 2A to 2E. As the first panel substrate 100P is cut, a plurality of first substrates 100 (FIG. 2C) may be formed from the first panel substrate 100P. To efficiently prevent cracks that may occur in a process of cutting the first panel substrate 100P using the punching facility PM, the punching facility PM may cut the first panel substrate 100P to have a shape in which corners of each of the first substrates 100 are rounded.

Referring to FIG. 5G, a card body 500 including a card substrate 520, a connection pad 530, and a security chip 11 may be prepared.

The card body 500 may include a groove region or recess 510 for mounting the fingerprint sensor package 10 thereon. The card substrate 520 and the security chip 11 for storing financial information may be disposed on the card body 500. For example, FPCB may be used as the card substrate 520. The security chip 11 may be mounted on the card substrate 520. The security chip 11 may be disposed within the card body 500 such that one surface thereof may be exposed externally. In addition, the connection pad 530 for electrical connection between the fingerprint sensor package 10 and other components in the card body 500 may be disposed on the card substrate 520. The connection pad 530 may include a conductive material. The fingerprint sensor package 10 may be aligned with the groove region 510 of the card body 500 such that an upper surface 200U of the second substrate 200 is exposed externally.

Referring to FIG. 5H, the fingerprint sensor package 10 may be mounted on the card body 500. A portion of the fingerprint sensor package 10 may be accommodated in the groove region 510 of the card body 500. The molding layer 350 of the fingerprint sensor package 10 may be accommodated in the groove region 510, and the external connection pad 130 of the first substrate 100 may be bonded to the connection pad 530 of the card substrate 520. The external connection pads 130 of the first substrate 100 may be physically and electrically connected to the connection pads 530 of the card substrate 520. In some embodiments, the groove region 510 may not be completely filled by the molding layer 350 of the fingerprint sensor package 10, and a flow space S between the molding layer 350 of the fingerprint sensor package 10 and the card body 500 may be formed. The flow space S may provide a space in which the fingerprint sensor package 10 flexibly responds to a degree of curvature of the smart card 1. In other embodiments, the flow space S may be filled by applying an adhesive.

Referring back to FIG. 1, the smart card 1 may include a fingerprint sensor package 10, a security chip 11, a display unit 12, and a power button 13. When a user touches a fingerprint to the fingerprint sensor package 10 of the smart card 1, a contacted fingerprint may be recognized. When a recognized fingerprint and a registered fingerprint match, the security chip 11 may grant payment authority to the user of the smart card 1.

A fingerprint sensor package according to an embodiment may have improved reliability, and may provide performance, not being damaged even after repeated use. In addition, the smart card according to an embodiment may have improved reliability, and may provide performance, not being damaged even after repeated use.

Various advantages and effects of the present inventive concept are not limited to the above description, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A fingerprint sensor package comprising:
a first substrate including a core insulating layer including a first surface and an opposite second surface and a through-hole extending through the first and second surfaces, a first bonding pad disposed along a circumference of the through-hole on the second surface of the core insulating layer, and an external connection pad between an edge of the second surface of the core insulating layer and the first bonding pad;
a second substrate in the through-hole of the core insulating layer and including a third surface and an opposite fourth surface, the second substrate including a plurality of first sensing patterns on the third surface, spaced apart in a first direction and extending in a second direction intersecting the first direction, a plurality of second sensing patterns spaced apart from each other in the second direction and extending in the first direction, and a second bonding pad on the fourth surface;
a conductive support vertically overlapping the first substrate and the second substrate, supporting the first substrate and the second substrate below the first substrate and the second substrate, and electrically connecting the first bonding pad and the second bonding pad to each other;
a controller chip on the second substrate; and
a molding layer on the second surface of the core insulating layer, at least partially filling the through-hole between the first substrate and the second substrate, covering at least a portion of the second substrate and the first bonding pad, and spaced apart from the external connection pad.

2. The fingerprint sensor package of claim 1, wherein the conductive support is connected to each of the first bonding pad and the second bonding pad by a conductive member.

3. The fingerprint sensor package of claim 2, wherein the conductive member comprises at least one of a solder bump, silver epoxy, or an anisotropic conductive film (ACF).

4. The fingerprint sensor package of claim 2, wherein the conductive support has a groove portion on a surface contacting the conductive member to limit a position at which the conductive member is attached.

5. The fingerprint sensor package of claim 1, wherein the conductive support has a rectangular bar shape.

6. The fingerprint sensor package of claim 1, further comprising a dummy support adjacent the conductive support and connecting the first substrate and the second substrate to each other.

7. The fingerprint sensor package of claim 6, wherein the first substrate further comprises a first dummy bonding pad disposed along the circumference of the through-hole,
the second substrate further comprises a second dummy bonding pad adjacent the second bonding pad, and
the dummy support is formed of the same material as the conductive support.

8. The fingerprint sensor package of claim 7, wherein at least one of the first dummy bonding pad and the second dummy bonding pad is electrically grounded.

9. The fingerprint sensor package of claim 7, wherein the dummy support is formed of a material having higher rigidity than the conductive support.

10. The fingerprint sensor package of claim 7, wherein the dummy support vertically overlaps the first substrate in each outer corner region of the second substrate.

11. The fingerprint sensor package of claim 7, wherein an area of the dummy support is larger than an area of the conductive support.

12. The fingerprint sensor package of claim 1, wherein the first substrate further comprises a ground bezel extending along a circumference of the through-hole on the first surface of the core insulating layer,
wherein a horizontal distance between an edge of the first surface of the core insulating layer and the ground bezel is shorter than a horizontal distance between the edge of the first surface of the core insulating layer and the first bonding pad.

13. The fingerprint sensor package of claim 1, wherein the second substrate further comprises:
a base layer;
a lower insulating layer on a lower surface of the base layer; and
an upper insulating layer on an upper surface of the base layer,
wherein the plurality of first sensing patterns are on the upper surface of the base layer,
the plurality of second sensing patterns are on an upper surface of the upper insulating layer,
the second bonding pad and the controller chip are on a lower surface of the lower insulating layer.

14. The fingerprint sensor package of claim 13, further comprising:
an upper protective layer covering the upper surface of the upper insulating layer; and
a lower protective layer covering the lower surface of the lower insulating layer.

15. A fingerprint sensor package comprising:
a first substrate including a core insulating layer including a first surface and an opposite second surface, the first substrate including a through-hole, a first bonding pad extending along a circumference of the through-hole on the second surface, and an external connection pad on an edge of the second surface;
a second substrate including a third surface including a sensing region and a peripheral region surrounding the sensing region and a fourth surface opposite to the third surface, and including a second bonding pad extending along an edge of the fourth surface;
a conductive support vertically overlapping the first substrate and the second substrate, supporting the first substrate and the second substrate below the first substrate and the second substrate, and electrically connecting the first bonding pad and the second bonding pad to each other; and
a controller chip on the fourth surface.

16. The fingerprint sensor package of claim 15, wherein the conductive support is connected to each of the first bonding pad and the second bonding pad by a conductive member,
wherein the conductive member includes at least one of a solder bump, silver epoxy, and an anisotropic conductive film (ACF).

17. The fingerprint sensor package of claim 15, wherein the core insulating layer is a flexible film.

18. A smart card comprising:
a card body including a groove region and a contact pad;
a security chip in the card body; and
a fingerprint sensor package configured to sense a user's fingerprint and transmit a signal for a sensing result to the security chip,
wherein the fingerprint sensor package includes:
a first substrate including a core insulating layer including a first surface and a second surface, opposite to each other, and having a substantially rectangular or square ring shape with a through-hole passing through the first and second surfaces, a first bonding pad disposed along a circumference of the through-hole on the second surface of the core insulating layer, and an external connection pad between an edge of the second surface of the core insulating layer and the first bonding pad;
a second substrate in the through-hole of the core insulating layer and including a third surface and a fourth surface, opposite to each other, and including a plurality of first sensing patterns spaced apart in a first direction and extending in a second direction, perpendicular to the first direction, a plurality of second sensing patterns spaced apart from each other in the second direction and extending in the first direction, and a second bonding pad;
a conductive support vertically overlapping the first substrate and the second substrate, supporting the first substrate and the second substrate below the first substrate and the second substrate, and electrically connecting the first bonding pad and the second bonding pad to each other;
a controller chip on the second substrate; and
a molding layer on the second surface of the core insulating layer, filling the through-hole between the first substrate and the second substrate, at least partially covering the second substrate and the first bonding pad, and spaced apart from the external connection pad.

19. The smart card of claim 18, wherein the first surface of the first substrate is coplanar with the third surface of the second substrate.

20. The smart card of claim 18, wherein the first substrate is a flexible PCB (FPCB), and
the second substrate is a rigid type printed circuit board (PCB).

* * * * *